(12) United States Patent
Choy et al.

(10) Patent No.: US 10,840,030 B2
(45) Date of Patent: Nov. 17, 2020

(54) ORGANOLEAD HALIDE PEROVSKITE FILM AND THE METHOD OF MAKING THE SAME

(71) Applicant: The University of Hong Kong, Hong Kong (CN)

(72) Inventors: Wallace Chik Ho Choy, Hong Kong (CN); Hong Zhang, Hong Kong (CN)

(73) Assignee: THE UNIVERSITY OF HONG KONG, Hong Kong (CN)

(*) Notice: Subject to any disclaimer, the term of this patent is extended or adjusted under 35 U.S.C. 154(b) by 43 days.

(21) Appl. No.: 16/311,491

(22) PCT Filed: Jun. 30, 2016

(86) PCT No.: PCT/CN2016/087831
§ 371 (c)(1),
(2) Date: Dec. 19, 2018

(87) PCT Pub. No.: WO2018/000294
PCT Pub. Date: Jan. 4, 2018

(65) Prior Publication Data
US 2019/0206630 A1 Jul. 4, 2019

(51) Int. Cl.
*H01L 51/00* (2006.01)
*H01L 51/42* (2006.01)
(Continued)

(52) U.S. Cl.
CPC ......... *H01G 9/2059* (2013.01); *H01L 31/032* (2013.01); *H01L 31/18* (2013.01);
(Continued)

(58) Field of Classification Search
CPC ............... C09K 11/06; C09K 11/025; C09K 2211/188; H01G 9/2004; H01G 9/2059;
(Continued)

(56) References Cited

U.S. PATENT DOCUMENTS 9,808,781 B2 11/2017 Choy et al.
2015/0287852 A1 10/2015 Leung et al.

FOREIGN PATENT DOCUMENTS

CN 103996749 A 8/2014
CN 104934503 A 9/2015
(Continued)

OTHER PUBLICATIONS

Cao et al. Identifying the Molecular Structures of Intermediates for Optimizing the Fabrication of High-Quality Perovskite Films, JACS, 2016, 138, pp. 9919-9926 (Year: 2016).*
(Continued)

*Primary Examiner* — Francisco W Tschen
(74) *Attorney, Agent, or Firm* — Leydig, Voit & Mayer, Ltd.

(57) ABSTRACT

A method for room-temperature fabrication of an organolead halide perovskite film includes: forming a PbX2.(L)y film based on solid-gas reactions between ligand (L) vapor and a PbX2 film at room temperature; forming a perovskite film by exposing the PbX2.(L)y film to a solution of organic ammonium halide at room temperature; removing the perovskite film from the solution of organic ammonium halide; washing the perovskite film; drying the perovskite film; exposing the perovskite film to a methylamine/alcohols gas mixture; removing the perovskite film from the methylamine/alcohols gas mixture; and drying the perovskite film.

15 Claims, 25 Drawing Sheets

(51) Int. Cl.
    H01G 9/20      (2006.01)
    H01L 31/032    (2006.01)
    H01L 31/18     (2006.01)
(52) U.S. Cl.
    CPC ...... *H01L 51/0003* (2013.01); *H01L 51/0008* (2013.01); *H01L 51/0025* (2013.01); *H01L 51/0077* (2013.01); *H01L 51/424* (2013.01)
(58) Field of Classification Search
    CPC ............. H01L 51/0003; H01L 51/0077; H01L 51/5032; H01L 51/5012; H01L 51/4253; H01L 31/032; H01L 31/18; H01L 51/0008; H01L 51/0025; H01L 51/424; Y02E 10/542; Y02E 10/549
    See application file for complete search history.

(56) References Cited

FOREIGN PATENT DOCUMENTS

| CN | 104966763 A | 10/2015 |
|---|---|---|
| CN | 105355724 A | 2/2016 |
| CN | 105355794 A | 2/2016 |

OTHER PUBLICATIONS

Zhang et al., A Smooth CH3NH3PbI3 Film via a New Approach for Forming the PbI2 Nanostructure Together with Strategically High CH3NH3I Concentration for High Efficient Planar-Heterojunction Solar Cells AEM, 2015, p. 1501354 (Year: 2015).*

Cae et al. (Cao2), High quality perovskite films fabricated from Lewis acid-base adduct through molecular exchange, RSC Adv., 2016, 6, 70925-7093 (Year: 2016).*

Ahn et al., "Highly Reproducible Perovskite Solar Cells with Average Efficiency of 18.3% and Best Efficiency of 19.7% Fabricated via Lewis Base Adduct of Lead(II) Iodide," *Chem. Soc.*, 137: 8696-8699 (2015).

Bansode et al., "Hybrid Perovskite Films by a New Variant of Pulsed Excimer Laser Deposition: A Room-Temperature Dry Process," *J. Phys. Chem. C*, 119: 9177-9185 (2015).

Burschka et al., "Sequential deposition as a route to high-performance perovskite-sensitized solar cells," *Nature*, 499: 316-320 (2013).

Chen et al., Non-Thermal Annealing Fabrication of Efficient Planar perovskite Solar Cells with Inclusion of NH$_4$Cl*Chem. Mater.*, 27, 1448-1451 (2015).

Gao et al., "Organohalide lead perovskites for photovoltaic applications", *Energy Environ. Sci.* 7, (17 pages) (2014).

Jeon et al., "Solvent engineering for high-performance inorganic-organic hybrid perovskite solar cells", *Nat Mater*.13, 897-903 (2014).

Kim et al., "Parameters Affecting I-V Hysteresis of CH$_3$NH$_3$PbI$_3$ perovskite Solar Cells: Effects of Perovskite Crystal Size and Mesoporous TiO$_2$ Layer", *J. Phys. Chem. Lett.* 5, 2927-2934 (2014).

Liu et al., "Perovskite solar cells with a planar heterojunction structure prepared using room-temperature solution processing techniques", *Nat. Photon.* 8, 133-138, (2014).

Shao et al., "Origin and elimination of photocurrent hysteresis by fullerene passivation in CH$_3$NH$_3$PbI$_3$ planar heterojunction solar cells", *Nat. Commun.* 5, 1-7 (2014).

Wu et al., "Retarding the crystallization of PbI$_2$ for highly reproducible planar-structured perovskite solar cells via sequential deposition", *Energy Environ. Sci.*, 7, 2934-2938 (2014).

Yang et al., "High-performance photovoltaic perovskite layers fabricated through intramolecular exchange", *Science*, 348, 1234-1238 (2015).

Zhang et al., "A Smooth CH$_3$NH$_3$PbI$_3$ Film via a New Approach for Forming the PbI2 Nanostructure Together with Strategically High CH$_3$NH$_3$I Concentration for High Efficient Planar-Heterojunction Solar Cell", *Adv. Energy Mater.*, 5, 1501354, pp. 1-10 (2015).

Zhao et al., Anomalously large interface charge in polarity-switchable photovoltaic devices: an indication of mobile ions in organic-inorganic halide perovskites, *Energy Environ. Sci.*, 8, 1256-1260 (2015).

Lu et al., "Selective Growth and Integration of Silver Nanoparticles on Silver Nanowires at Room Conditions for Transparent Nano-Network Electrode," *ACS Nano*, 8(10):10980-10987 (2014).

Lu et al., "Locally Welded Silver Nano-Network Transparent *Electrodes with High Operational Stability by a Simple Alcohol-Based Chemical Approach,"* Adv. Funct. Mater. 25: 4211-4218 (2015).

State Intellectual Property Office of the P.R.China, International Search Report and the Written Opinion in International Application No. PCT/CN2016/087831 (dated Mar. 31, 2017).

* cited by examiner

ORGANOLEAD HALIDE PEROVSKITE FILM AND THE METHOD OF MAKING THE SAME

CROSS-REFERENCE TO RELATED APPLICATIONS

This application is a U.S. National Phase application under 35 U.S.C. § 371 of International Application No. PCT/CN2016/087831, filed on Jun. 30, 2016, which is incorporated herein by reference in its entirety. The International Application was published in English on Jan. 4, 2018 as WO 2018/000294 A1 under PCT Article 21(2).

FIELD

The present invention relates to solar energy generation, and particularly to photovoltaic films and methods of making them.

BACKGROUND

Electricity is the most convenient and safe form of energy in our daily life, so the demand for electricity is gradually increasing as populations increase and industry develops. Therefore, direct generation of electricity from solar energy is of great interest because it is clean, renewable, abundant, and sustainable. However, the power generation cost of solar cells is still more expensive than conventional fossil fuel, so there are limits on the widespread applications of solar cells. Accordingly, significant effort is being devoted to achieving a breakthrough in the development of cost-effective innovative solar cells by enhancing power conversion efficiency and reducing processing cost at the same time.

Recently innovative solar cells satisfying such criteria have been reported. These are the perovskite solar cells (PVSCs), which can be fabricated in an all solution process and which have a record power conversion efficiency of 22.1% at 1 sun condition (100 mW/cm$^2$ AM 1.5 G). However, the most advanced PVSCs still require a series of high-temperature sintering or annealing processes, which increase the fabrication cost and energy consumption. Furthermore, the high annealing temperature may be a concern for fabrication on flexible substrates. Flexible substrates enable the implementation of large scale portable and roll-to-roll fabrication. Since the cost and scalable capability are the key issues for their practical applications, low temperature and solution processed approaches for each layer of PVSCs are highly desirable.

SUMMARY

In an exemplary embodiment, the invention provides a method for room-temperature fabrication of an organolead halide perovskite film. The method comprises: forming a PbX2.(L)y film based on solid-gas reactions between ligand (L) vapor and a PbX2 film at room temperature; forming a perovskite film by exposing the PbX2.(L)y film to a solution of organic ammonium halide at room temperature; removing the perovskite film from the solution of organic ammonium halide; exposing the perovskite film to a methylamine/alcohols gas mixture; removing the perovskite film from the methylamine/alcohols gas mixture; and drying the perovskite film.

In another exemplary embodiment, the invention provides a method for room-temperature solution-processed fabrication of a flexible perovskite solar cell. The method comprises: depositing a formation solution comprising NiOx nanoparticles dissolved therein on a flexible transparent conductive substrate, such that the NiOx nanoparticles form a nanostructured NiOx; fabricating an organolead halide perovskite film; depositing an electron transport layer on the organolead halide perovskite film; and depositing a conductive electrode on the electron transport layer.

In yet another exemplary embodiment, the present invention provides a flexible perovskite solar cell. The solar cell comprises: a flexible transparent conductive substrate; a perovskite film, configured to act as an absorber and located on the substrate; an electron transport layer on the perovskite film; and a conductive electrode on the electron transport layer; wherein the perovskite film exhibits a highly crystalline phase having an X-ray diffraction (XRD) peak relative intensity of (110):(220):(330)=1:0.67:0.09 and grain size in a range of 300-600 nm.

BRIEF DESCRIPTION OF THE DRAWINGS

The invention will be described in even greater detail below based on the exemplary figures. The invention is not limited to the exemplary embodiments. All features described and/or illustrated herein can be used alone or combined in different combinations in embodiments of the invention. The features and advantages of various embodiments of the invention will become apparent by reading the following detailed description with reference to the attached drawings, which illustrate the following.

DETAILED DESCRIPTION

Figure 1:
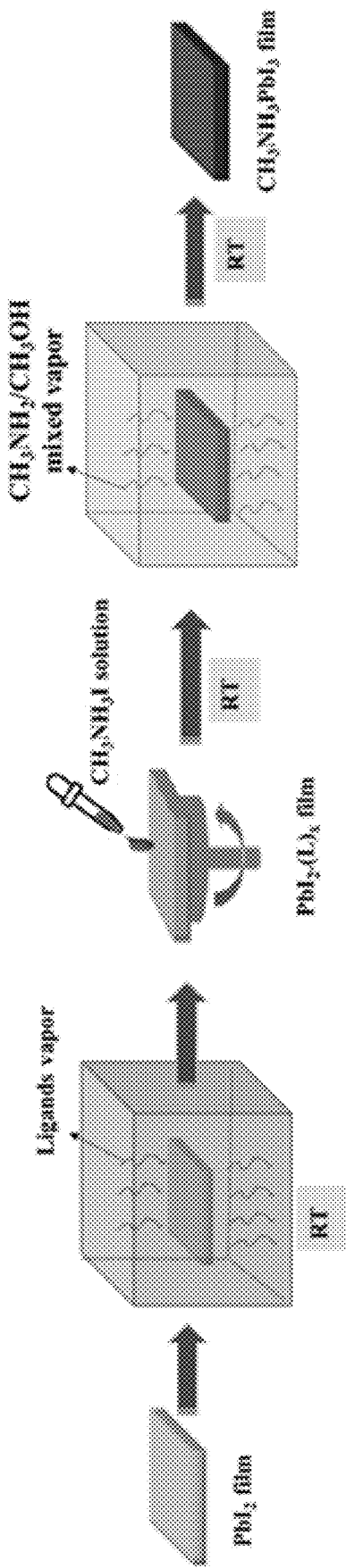
FIG. 1 is a schematic of room-temperature fabrication of organolead halide perovskite films according to embodiments of the subject invention.

Embodiments of the present invention provide methods of fabricating room-temperature solution-processed organolead halide perovskite films, as well as all-room-temperature fabrication of high-performance bendable perovskite optoelectronic devices using such perovskite organolead halide films. It will be appreciated that "all-room-temperature fabrication" as referred to herein refers to all of the fabrication steps being performed or performable at room temperature.

In an exemplary embodiment, a method of fabricating room-temperature solution-processed organolead halide perovskite film includes: forming $PbX_2$ solutions; forming $PbX_2$ films; drying the $PbX_2$ films naturally; forming $PbX_2.(L)_y$ film in situ by solid-gas reactions between ligand (L) vapor and $PbX_2$ film (X=I, Br, Cl, $C_2H_3O_2$) at room temperature; forming perovskite film by exposing the $PbX_2.(L)_y$ film to a solution of organic ammonium halide at room temperature; removing the resultant perovskite film from the organic ammonium halide solution; washing the perovskite film with isopropyl alcohol (IPA) and drying it naturally; exposing the as-formed perovskite film to a methylamine/alcohols gas mixture; removing the perovskite film from the methylamine/alcohols gas mixture; and drying the perovskite film.

In another exemplary embodiment, all-room-temperature processed flexible PVSCs are fabricated using the perovskite film described above as an absorber. The nanostructure-based $NiO_x$ film and commercial electron transport materials such as ZnO, and fullerene ($C_{60}$) are used to form a hole transport layer (HTL) and an electron transport layer (ETL) in the all-room-temperature solution-processed flexible PVSCs, respectively. The room-temperature processed electrode can be silver paste, gold paste, silver nano-networks (e.g., as described in Adv. Funct. Mater. 2015, 25, 4211-4218; ACS Nano, vol. 8, pp 10980-10987, 2014; and U.S. Pat. No. 9,808,781 B2), etc.

Exemplary embodiments of the present invention provide for fabrication of high-efficiency and flexible PVSCs, which can help to form a platform to leverage the development in green energy and flexible electronics. Regarding applications, the PVSCs have special advantages for use in new applications such as unmanned aerial vehicles—from airplanes to quadcopters and weather balloons—for environmental and industrial monitoring, rescue and emergency response, and tactical security applications.

Perovskite solar cells have drawn enormous attention because of their remarkably high efficiency and prospective low-cost fabrication. A new certificated efficiency of 22.10% has recently been achieved, and the theoretical limit of the PVSC efficiency has been estimated to be 31% based on the photon recycling effect through the detailed balance model. This makes them a very promising candidate to be used for next-generation photovoltaics.

Priority in the previous studies of PVSCs was given to improving their power conversion efficiencies (PCEs) by optimizing device structure and developing new interface materials. However, most of the state-of-the-art PVSCs require a series of high-temperature sintering or annealing processes to fabricate efficient carrier-transport layers (e.g., $TiO_2$, PEDOT:PSS, $NiO_x$) and perovskite absorbers (e.g., $CH_3NH_3PbI_3$). Various and multi-step processing conditions in forming each layer in multilayered PVSCs increase the fabrication complexity and energy consumption, and thus the cost and energy payback time. In addition, the high annealing temperature may be a concern for fabrication on flexible substrates. More importantly, it has been reported that the film quality (crystallinity, purity) and morphology of perovskite films are depend on the thermal annealing temperature. For example, traditional approaches employ thermal annealing to remove the organic residue (e.g., high-boiling-point solvents) in precursors and to improve the crystallization of perovskite films. However, thermal annealing for extended periods is known to cause the decomposition of perovskite films, which degrades the device performance and stability. Since cost and scalability are among the critical issues for their practical applications, low temperature and solution-processed methods for each layer of PVSC are highly desirable. Meanwhile, there has still been very limited study on fully room-temperature solution-processed fabrication of PVSCs, which is challenging and desirable so as to enable large-scale, roll-to-roll manufacturing of perovskite-based photovoltaics.

Embodiments of the present invention provide methods of fabricating all-room-temperature solution-processed organolead halide perovskite films, as well as all-room-temperature fabrication of high-performance bendable perovskite solar cells (PVSC) using such organolead halide perovskite films. It is a scalable process and the $CH_3NH_3PbI_3$ film produced provides good film quality and smooth morphology.

The basic process for producing the film is shown in FIG. 1. The first element of FIG. 1 shows that first, the $PbI_2.(L)_x$ film is prepared in situ by solid-gas reactions:

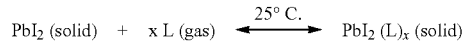

The ligand contains at least one component selected from pyridine ("Py"), 4-tert-butylpyridine ("TBP"), ethylene diamine ("DMSO"), N,N'-dimethylmethanaide ("DMF"), and dimethyl sulfoxide ("EDA").

Second, the high-purity perovskite film is produced by controllable ligand (L) exchange reactions:

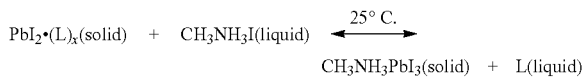

Subsequently, the crystallinity of $CH_3NH_3PbI_3$ films can be further improved by introducing $CH_3NH_2/CH_3CH_2OH$ mixed vapor treatment, again under room temperature. All-room-temperature solution processed PVSCs can be fabricated with the configuration of $ITO/NiO_x/CH_3NH_3PbI_3/C_{60}/$ Bis-$C_{60}$/Ag, where room-temperature solution-processed NiO$_x$ nanostructure, C$_{60}$, and Bis-C$_{60}$ surfactant as HTL, ETL, and interface layer, respectively.

Methods according to exemplary embodiments of the present invention provide a simple and low cost approach for the fabrication of high-quality perovskite films at room temperature. In one embodiment, a method of fabricating room-temperature solution-processed organolead halide perovskite film can include: forming PbX$_2$ solutions; forming PbX$_2$ films; drying the PbX$_2$ films naturally; forming PbX$_2$.(L)$_y$ film in situ by solid-gas reactions between ligand (L) vapor and PbX$_2$ film; forming perovskite film by exposing the PbX$_2$.(L)$_y$ film in a solution of organic ammonium halide at room temperature; removing the resultant perovskite film from the organic ammonium halide solution; washing the perovskite film with isopropyl alcohol (IPA) and drying it naturally; exposing the as-formed perovskite film in a methylamine/alcohols gas mixture; removing the perovskite film from the methylamine/alcohols gas mixture; and drying the perovskite film. The room temperature processed perovskite films exhibit a highly crystalline phase with strong (110) preferred orientation [X-ray diffraction (XRD) peak relative intensity: (110):(220):(330)=1:0.67:0.09] and large grain sizes (300-600 nm; others <300 nm). These properties can be easily measured by standard equipment such as X-ray diffraction (XRD) and scanning electron microscope (SEM). In many embodiments, no expensive or hi-tech equipment is required. Low cost materials can be used, and the energy required can also be low, leading to low power consumption. The process can be carried out at room temperature. No toxic by-products are needed or generated during the process.

The PbX$_2$ can be PbI$_2$, PbBr$_2$, PbCl$_2$, Pb(C$_2$H$_3$O$_2$)$_2$ or a mixture thereof, although the present invention is not limited thereto.

The PbX$_2$ film can be formed by, for example, depositing a solution of PbX$_2$ on a substrate through, e.g., spin coating, drop casting, spray coating, Mayer rod techniques, and/or doctor blade techniques. The as-formed PbX$_2$ films are dried naturally without annealing. The dimensions of the PbX$_2$ films can be any suitable value known in the art. The dimension shown in the examples discuss herein are for exemplary purposes only and should not be construed as limiting. The solvent can be, for example, N,N'-dimethylmethanaide (DMF), dimethyl sulfoxide (DMSO), N-Methyl-2-pyrrolidone (NMP) or any combination thereof, although the present invention is not limited thereto.

The concentration of the PbX$_2$ solution can be in the range of about 0.05 to 1.50. For example, it can be any of the following values, about any of the following values, at least any of the following values, no more than any of the following values, or within any range having any of the following values as endpoints (all values are in millimolar (mM)), although the present invention is not limited thereto: 0.05, 0.10, 0.15, 0.20, 0.25, 0.30, 0.35, 0.40, 0.45, 0.50, 0.55, 0.60, 0.65, 0.70, 0.75, 0.80, 0.85, 0.90, 0.95, 1.0, 1.05, 1.10, 1.15, 1.20, 1.25, 1.30, 1.35, 1.40, 1.45, 1.50. For example, the concentration of PbI$_2$ within a DMF solution can be between 0.05 mM and 1.05 mM at room temperature. In a particular embodiment, the PbI$_2$ within a DMSO solution is between 0.05 mM and 1.30 mM.

Thanks to the two-dimensional structure of PbX$_2$, the interlayer spaces allow rapid intercalation of different guest molecules owing to the weak bonding between the two planes by van der Waals-type interactions, leading to the expansion of the interlayer distance along the c axis. Bearing this in mind, PbX$_2$.(L)$_y$ films are easily synthesized in situ by solid-gas reactions between PbX$_2$ films and chemical ligand (L) vapors at room temperature. The formation and composition of PbX$_2$.(L)$_y$ complexes can be confirmed from UV-vis spectra and XRD patterns.

The ligand for preparing the PbX$_2$.(L)$_y$ films can be pyridine (Py), 4-tert-butylpyridine (TBP), ethylene diamine (EDA), DMF, DMSO, or a mixture thereof, although the present invention is not limited thereto. The morphology and reactivity toward organic ammonium halide of the PbX$_2$.(L)$_y$ complexes can be determined by the value of y and the type of ligand. The value of y can be determined by the reaction time between PbX$_2$ and ligand vapors. The reaction time between PbX$_2$ and ligand vapors can be in the range of about 10 sec. to 1000 sec. For example, it can be, for example, any of the following values, about any of the following values, at least any of the following values, no more than any of the following values, or within any range having any of the following values as endpoints (all values are in seconds), although the present invention is not limited thereto: 10, 20, 30, 40, 50, 60, 70, 80, 90, 100, 110, 120, 130, 140, 150, 160, 170, 180, 190, 200, 210, 220, 230, 240, 250, 260, 270, 280, 290, 300, 350, 400, 450, 500, 550, 600, 650, 700, 750, 800, 850, 900, 950, or 1000.

The organic ammonium halide can be, for example, methylammonium iodide, methylammonium bromide, methylammonium chloride, formamidinium iodide, formamidinium bromide, formamidinium chloride, or a mixture thereof, although the present invention is not limited thereto.

The concentration of the organic ammonium halide can be in the range of about 0.03 to 0.50. For example, it can be any of the following values, about any of the following values, at least any of the following values, no more than any of the following values, or within any range having any of the following values as endpoints (all values are in millimolar (mM)), although the present invention is not limited thereto: 0.03, 0.04, 0.05, 0.06, 0.07, 0.08, 0.09, 0.10, 0.15, 0.20, 0.25, 0.30, 0.35, 0.40, 0.45 or 0.50. For example, the concentration of organic ammonium halide within an isopropyl alcohol (IPA), solution can be between 0.03 mM and 0.50 mM. In a particular embodiment, the organic ammonium halide is methylammonium iodide and the concentration of methylammonium iodide within an IPA solution is between 0.03 mM and 0.40 mM.

The immersing time of PbX$_2$.(L)$_y$ in organic ammonium halide can be in the range of about 10 to 1000 sec. For example, it can be any of the following values, about any of the following values, at least any of the following values, no more than any of the following values, or within any range having any of the following values as endpoints (all values are in seconds), although the present invention is not limited thereto: 10, 20, 30, 40, 50, 60, 70, 80, 90, 100, 110, 120, 130, 140, 150, 160, 170, 180, 190, 200, 210, 220, 230, 240, 250, 260, 270, 280, 290, 300, 350, 400, 450, 500, 550, 600, 650, 700, 750, 800, 850, 900, 950, or 1000. For example, the immersing time of PbX$_2$.(L)$_y$ within a methylammonium iodide IPA solution can 10-60 seconds. In a particular embodiment, the PbX$_2$.(L)y is PbI$_2$(Py)$_2$ and the immersing time of PbI$_2$(Py)$_2$ within methylammonium iodide IPA solution is 20 sec. or about 20 sec.

The step of drying the perovskite films can be carried out by any suitable process known in the art, including but not limited to blow drying, vacuum drying, air drying, or any combination thereof.

The alcohols in the step of methylamine/alcohols mixture treatment can be, for example, methanol, ethanol, IPA, or a mixture thereof, although the present invention is not limited thereto. The ratio of the methylamine to the alcohols can be in the range of about 1:20 to 20:1. For example, it can be any of the following values or about any of the following values (all ratios are by weight), although the present invention is not limited thereto: 1:20, 1:19, 1:18, 1:17, 1:16, 1:15, 1:14, 1:13, 1:12, 1:11, 1:10, 1:9, 1:8, 1:7, 1:6, 1:5, 1:4, 1:3, 1:2, 1:1, 2:1, 3:1, 4:1, 5:1, 6:1, 7:1, 8:1, 9:1, 10:1, 11:1, 12:1, 13:1, 14:1, 15:1, 16:1, 17:1, 18:1, 19:1, or 20:1. For example, the alcohol in methylamine/alcohols mixture can be ethanol. In a particular embodiment, the ratio of the methylamine to the ethanol is 1:3.

The duration of time of the treatment of the methylamine/alcohols gas mixture can be in the range of about 1 to 60. For example, it can be any of the following values, about any of the following values, at least any of the following values, no more than any of the following values, or within any range having any of the following values as endpoints (all values are in seconds), although the present invention is not limited thereto: 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, 55, 60. For example, the treatment duration can be 1-5 seconds for methylamine/ethanol gas mixture.

The features (molecular size, volatility, solubility, and coordination ability toward $PbX_2$ of the ligand have great impact on the formation of perovskite films. As for $PbX_2.(L)_y$ complexes, the conversion rate of $PbX_2$ to $PbX_2.(L)_y$ complex is controlled by the volatility of the ligand (see Table 1). Besides, the reactivity of the $PbX_2.(L)_y$ complexes toward organic ammonium halide is determined by the coordination ability of the ligands. Furthermore, the molecular size and solubility of the ligands will affect the morphology of the $PbX_2.(L)_y$ film. On one hand, the insertion of ligands into the interlayer space of the $PbX_2$ will cause volume expansion and thus a different morphology from the initial $PbX_2$ film at a nanometer scale. On the other hand, the solubility of $PbX_2$ in the ligands (see Table 1) is also an important factor. If the solubility of $PbX_2$ in the chemical ligands is too large, i.e. DMF (475 mg ml$^{-1}$) and DMSO (595 mg ml$^{-1}$), the morphological structure of the $PbX_2.(L)_y$ film will change a lot at a large scale (micrometer scale) due to the ligand vapors. On the contrary, the morphology of the final $PbX_2.(L)_y$ films (L=Py, TBP, and DEA) will not be changed at a large scale. In the process of perovskite film formation, the morphology of $PbX_2.(L)_y$ films and reactivity of the $PbX_2.(L)_y$ complexes toward organic ammonium halide are two key factors. The morphology of perovskite film is controlled by the morphology of $PbX_2.(L)_y$ films. The purity of perovskite is a result of the combining effects of the reactivity, conversion rate, and morphology of $PbX_2.(L)_y$ films.

Methods of the present invention can be carried out at room temperature and room pressure, i.e., at any suitable temperature and pressure present in a typical indoor setting. Advantageously, no toxic gases or chemicals are needed for the methods, and no toxic gases or chemicals are produced while the methods are carried out.

In another embodiment, all-room-temperature processed flexible perovskite solar cells (PVSCs) are fabricated using the perovskite film described above as an absorber. The nanostructure-based $NiO_x$ film and commercial electron transport materials such as ZnO, and fullerene ($C_{60}$) are used to form a hole transport layer (HTL) and an electron transport layer (ETL) in the all-room-temperature solution-processed flexible PVSCs, respectively. It would be understood by a person skilled in the art that the electron transport materials herein are not limited to these examples, and instead they can be any materials that are suitable for such electron transport materials. The room-temperature processed electrode can be silver paste, gold paste, silver nano-networks, etc. It would be understood by a person skilled in the art that the electrode materials herein are not limited to these examples, and instead the electrode can be fabricated from any materials that are suitable for such electrode. The substrate can be any suitable substrate known in the art, including but not limited to, indium tin oxide (ITO) transparent conductive glass, fluorine doped tin oxide (FTO) glass, metal foils, and a flexible transparent conductive substrate.

Figure 4A:
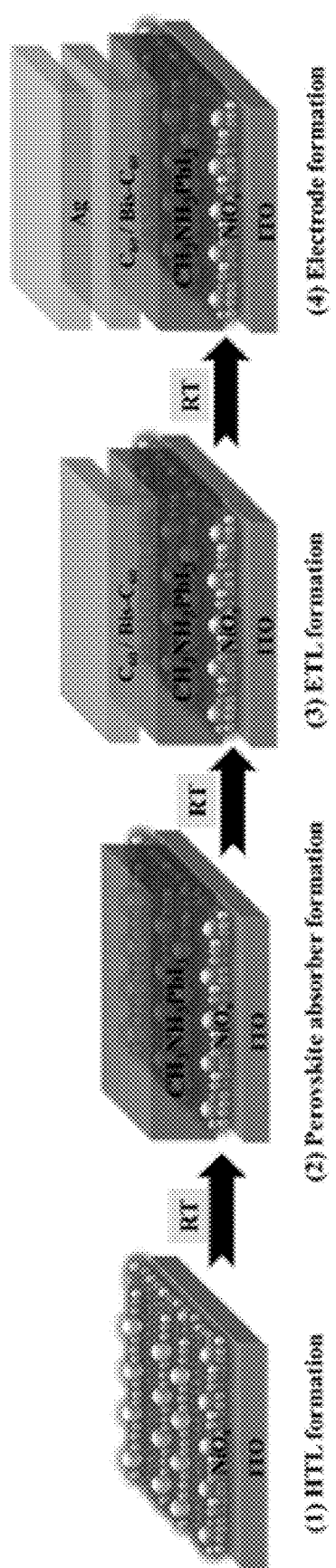
FIGS. 4(a)-(g) include: (a) a schematic of the all-room-temperature solution-processed fabrication process for PVSCs according to an embodiment of the present invention; (b) a J-V curve of an all-room-temperature solution-processed fabrication of $PbI_2.(Py)_2$-based PVSCs on an ITO glass substrate; (c) a plot of the photon-to-electron conversion efficiency (IPCE) spectra of the device of FIG. 4(b); (d) a plot of photocurrent output and PCE at the maximum power point (0.88 V) for the device of FIG. 4(b); (e) the PCE distribution histogram of $PbI_2.(Py)_2$-based PVSCs; (f) a plot of the PCE evolution of an encapsulated device of FIG. 4(b) stored in ambient air (45-65% humidity, 20-28° C.) for different numbers of days; and (g) J-V curves of a $PbI_2.(Py)_2$-based PVSC measured under different scan directions.

FIG. 4(a) is a schematic of an all-room-temperature solution-processed fabrication of PVSCs according to an embodiment of the present invention with the resulting product shown at the last step. In particular, FIG. 4(a) shows a series of continuous processing steps. First, ITO-coated glass substrates were cleaned and then ultraviolet-ozone treated for 20 min. Then, the $NiO_x$ nanoparticles aqueous ink (20 mg/mL in deionized water) was spin-coated onto pre-cleaned ITO glass to form nanostructured $NiO_x$ films. The resultant $NiO_x$ films are used to fabricate devices without an annealing process or other treatments. After forming perovskite films based on different ligands, the $C_{60}$ (20 mg/ml dissolved in dichlorobenzene) and Bis-$C_{60}$ surfactant (2 mg/mL in IPA) are then sequentially deposited by spin coating at 1,000 rpm for 60 sec. and 3,000 rpm for 30 sec., respectively. Finally, the device is completed with the evaporation of Ag contact electrodes (120 nm) through a shadow mask. The active area of this electrode was fixed at 6 mm$^2$. All devices were fabricated in a glove box.

Figure 4B:
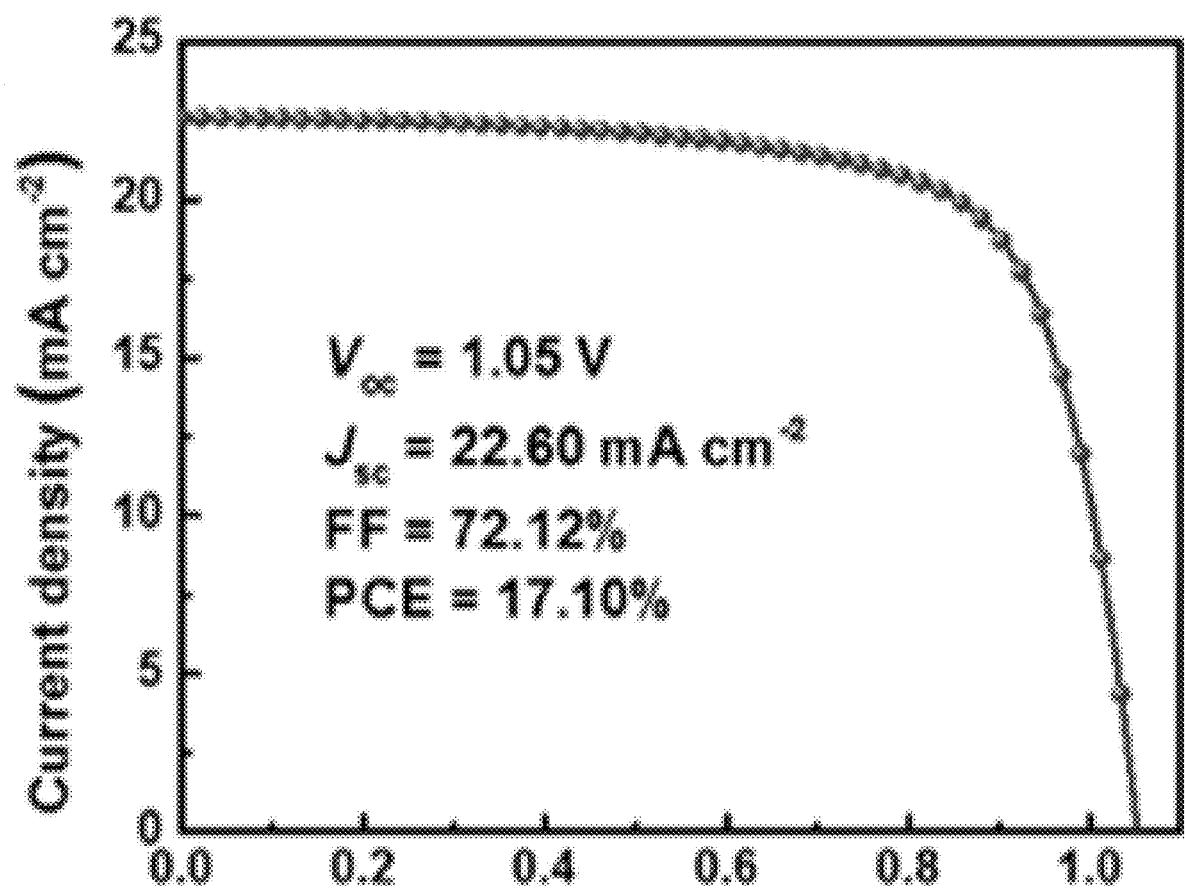
Figure 4C:
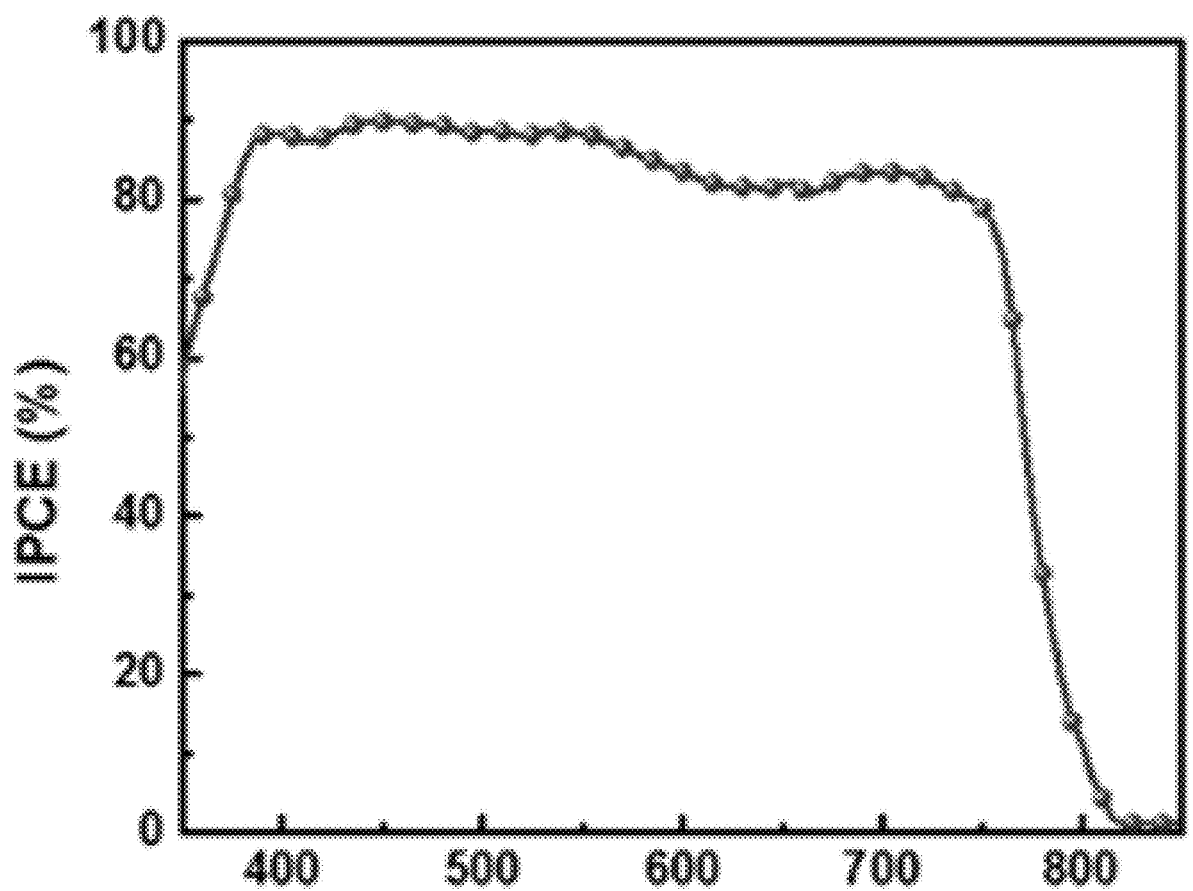
Figure 4D:
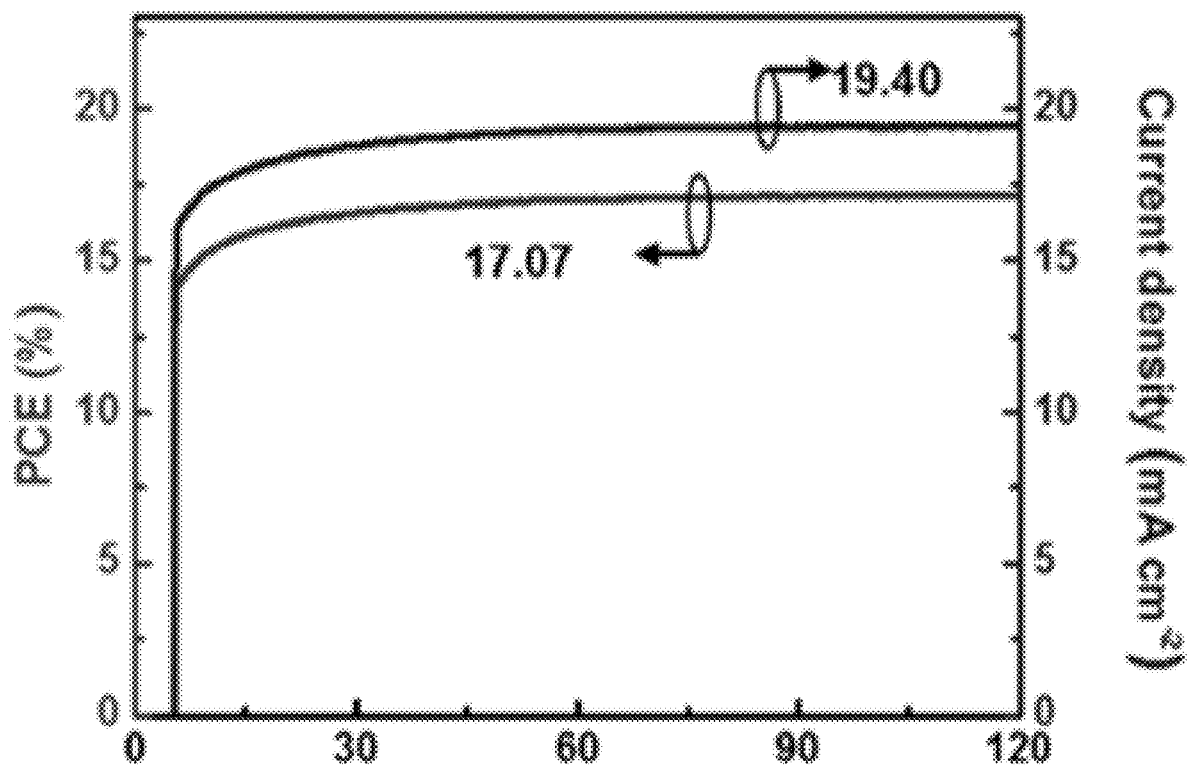
Figure 4E:
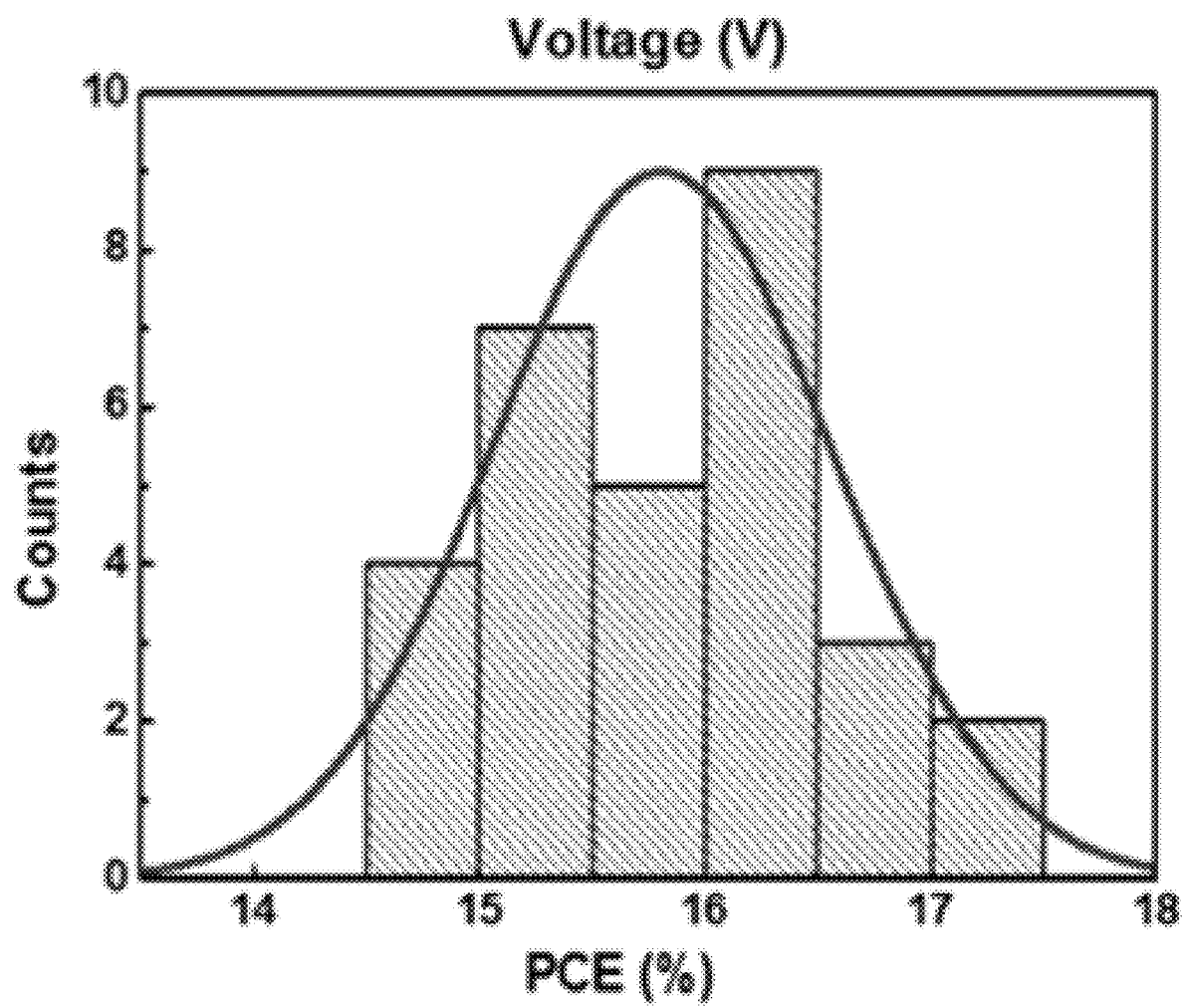
Figure 4F:
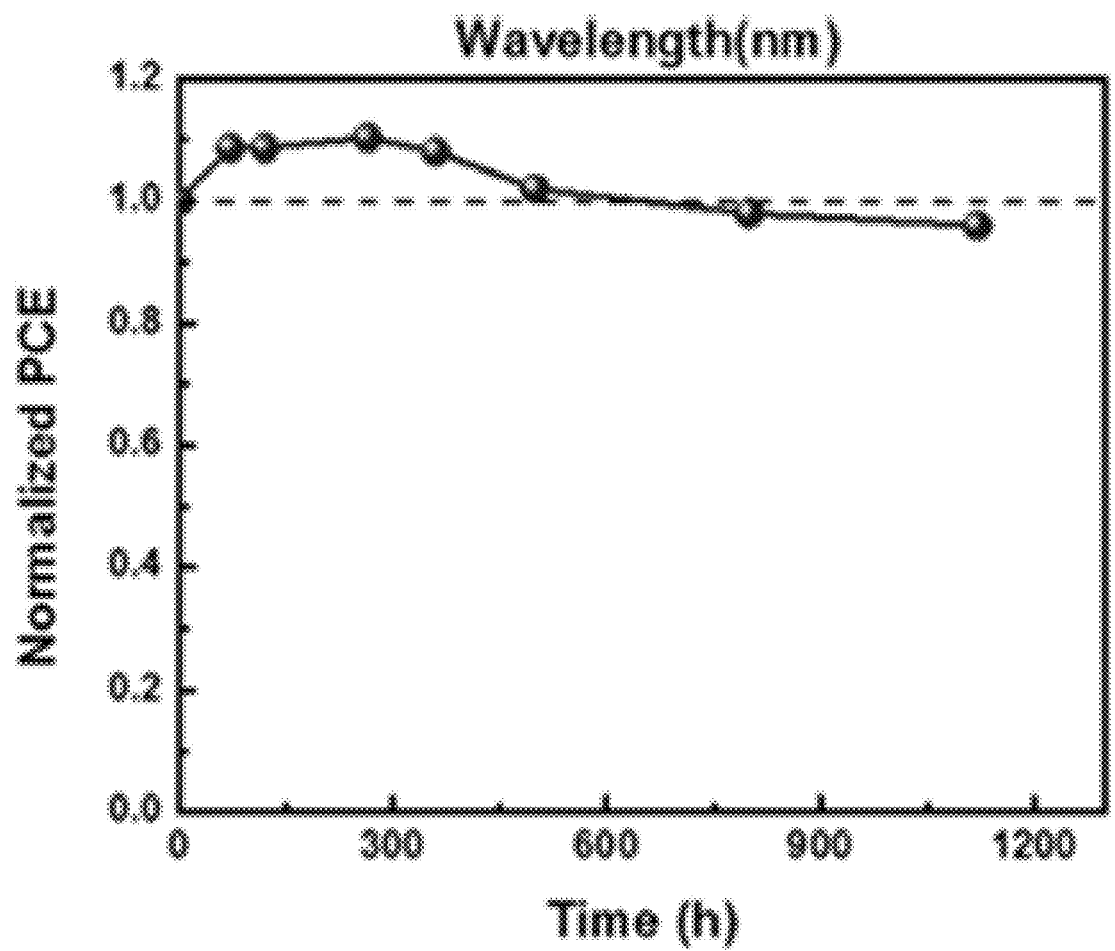
Figure 4G:
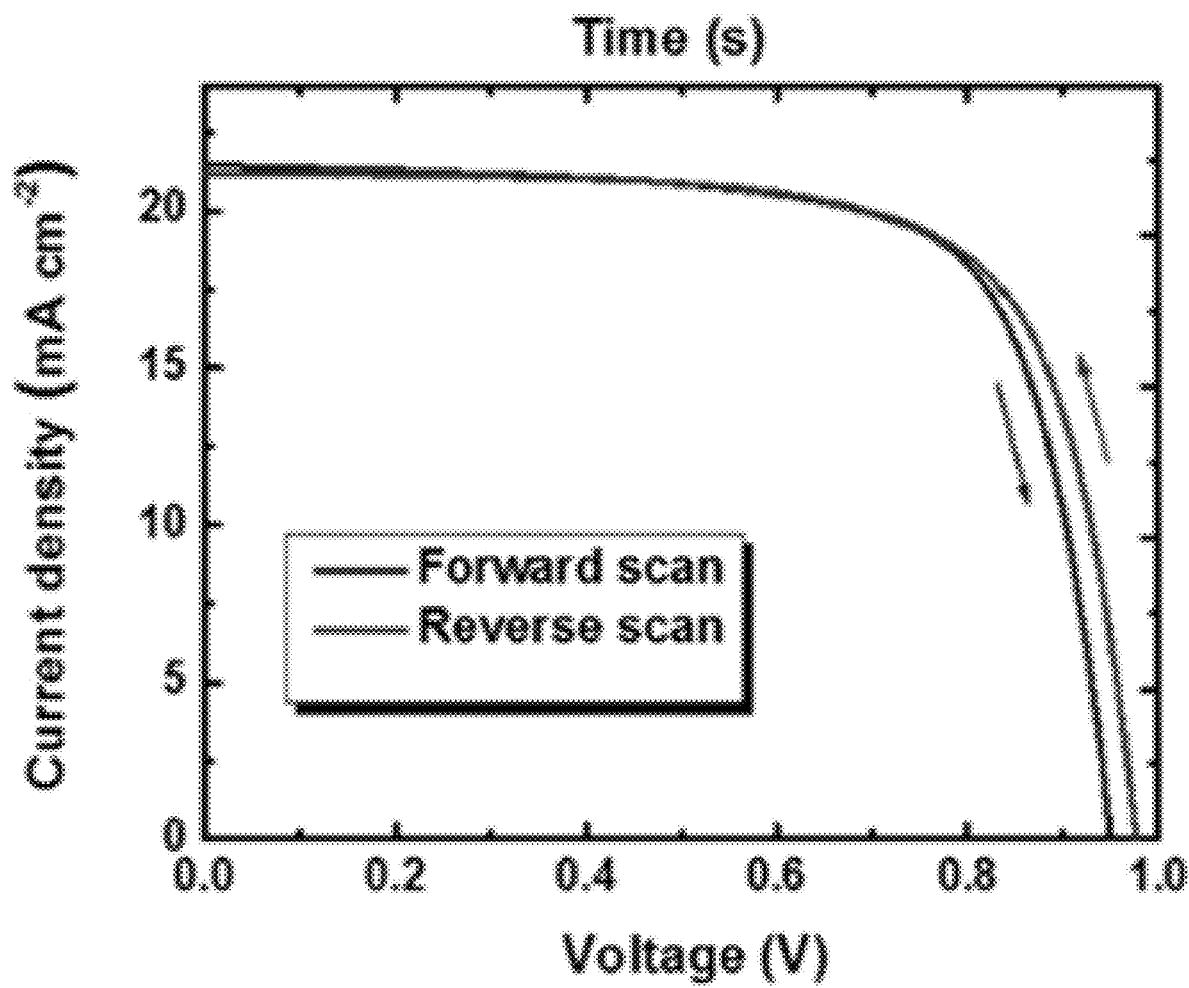

FIG. 4(b) is a J-V curve of an all-room-temperature solution-processed fabrication of $PbI_2.(Py)_2$-based PVSCs on an ITO glass substrate as shown at the last step in FIG. 4(a). FIG. 4(c) is a plot of IPCE spectra of the device of FIG. 4(a). FIG. 4(d) is a plot of the photocurrent output and PCE at the maximum power point (0.88 V) for the device of FIG. 4(a). FIG. 4(e) is the PCE distribution histogram of $PbI_2.(Py)_2$-based PVSCs of FIG. 4(a). FIG. 4(f) is a plot of the PCE evolution of an encapsulated device of FIG. 4(a) stored in ambient air (45-65% humidity, 20-28° C.) for different numbers of days. FIG. 4(g) is J-V curves of a $PbI_2.(Py)_2$-based PVSCs device of FIG. 4(a) measured under different scan directions.

The thickness of perovskite film can be in the range of about 50 to 1000 nanometers. For example, it can be any of the following values, no more than any of the following values, at least any of the following values, or within any range having any of the following values as endpoints (all values are in nanometers), although the present invention is not limited thereto: 50, 100, 150, 200, 250, 300, 350, 400, 450, 500, 550, 600, 650, 700, 750, 800, 850, 900, 950 or 1000. For example, the perovskite film thickness of high-performance PVSCs is around 300 nanometers.

In many embodiments, more than one $PbX_2$ or organic ammonium halide can be present in some or all of the perovskite films.

Following are examples that illustrate procedures for practicing the invention. These examples should not be construed as limiting. All percentages are by weight and all solvent mixture proportions are by volume unless otherwise noted.

Example 1

The $PbI_2$ precursor was prepared by dissolving 450 mg $PbI_2$ powder in 1 ml DMF, then spin coating it on a substrate at 4000 rpm for 60 sec. After the $PbI_2$ films were totally dried, the resultant $PbI_2$ films were treated by different chemical ligand vapors for different times to form $PbI_2.(L)_x$ films. The resulting PbI$_2$.(L)$_x$ films were then dipped in a solution of 15 mg methylammonium iodide per ml IPA for 20 sec., rinsed with IPA and dried with N$_2$ gas. The crystallization of the resulting methylammonium lead iodide raw films was improved by treatment with a methylamine/methanol gas mixture for 1-5 sec. The features of these ligands and PbI$_2$.(L)$_x$ films are shown in Table 1.

TABLE 1

The basic chemical properties of different chemical ligands

| Ligand | Boiling point (° C.) | PbI$_2$ solubility (mg/ml)$^a$ | PbI$_2$•(L)$_x$ conversion rate(s)$^b$ | PbI$_2$/L coordination ratio$^c$ | Theoretically calculated interlayer distance of PbI$_2$•(L)$_x$ (Å) |
|---|---|---|---|---|---|
| — | — | — | — | — | 6.918$^d$ |
| Py | 115 | <5 | 100 | 1:2 | 8.598 |
| TBP | 197 | 148 | 300 | 1:1 | 15.152 |
| DMSO | 189 | 595 | 140 | 1:2 | 8.437 |
| DMF | 153 | 475 | 50 | 1:1 | 9.196 |
| EDA | 116 | <5 | 50 | 1:2 | — |

$^a$PbI$_2$ (99%) was purchased from Sigma-Aldrich. The solubility test was conducted at room temperature (25° C.).
$^b$The progress of chemical reactions was monitored by UV-vis-spectra.
$^c$The data were estimated by TGA.
$^d$Theoretically calculated interlayer distance of PbI2

Figure 2A:
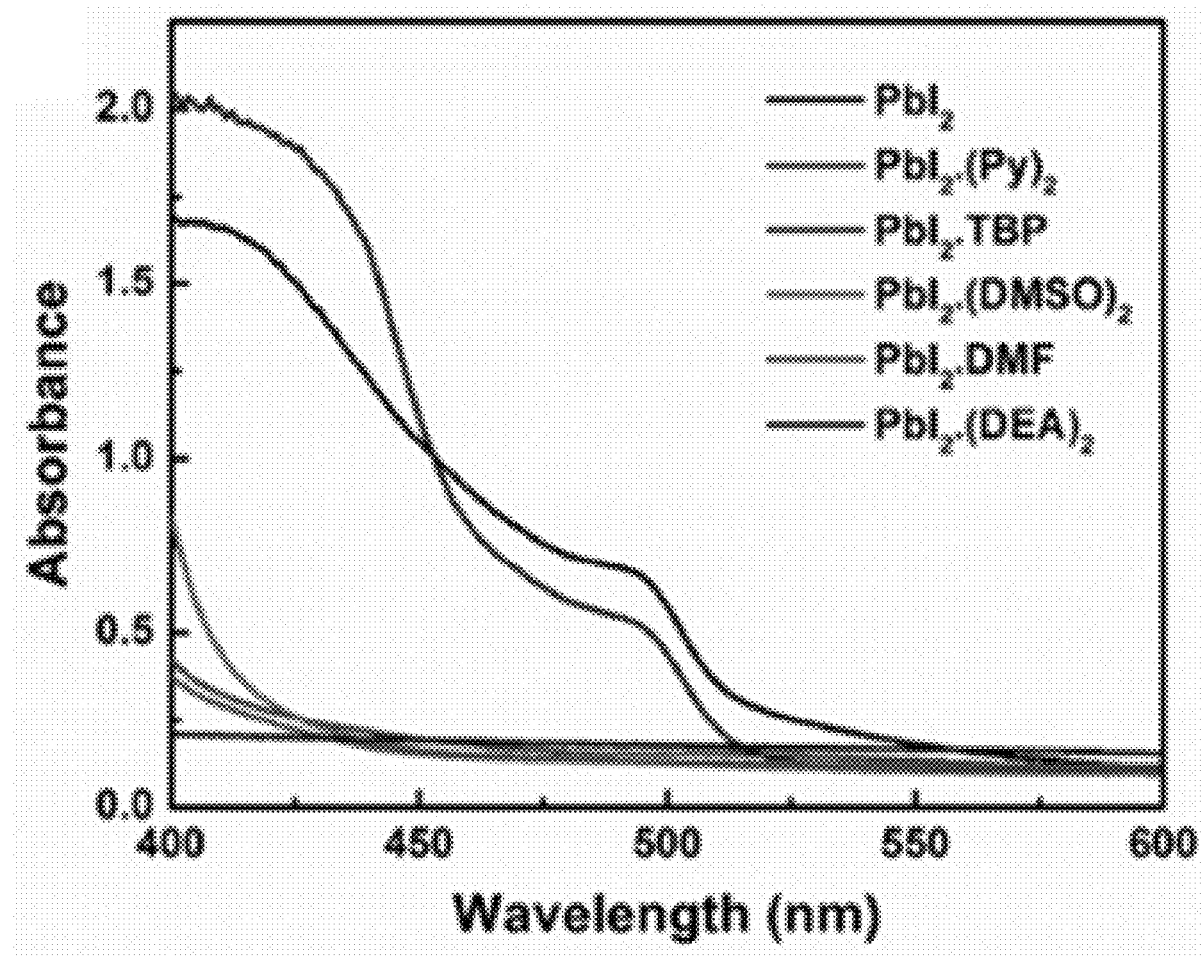
FIGS. 2(a)-(k) include: (a) a plot of UV-vis spectra of $PbI_2.(L)_x$ films; (b) a plot of X-ray powder diffraction (XRD) patterns of the $PbI_2.(L)_x$ films of FIG. 2(a); (c) a graph of theoretically calculated interlayer distances of the $PbI_2.(L)_x$ films of FIG. 2(a); (d) a top-view of scanning electron microscope (SEM) images of the pristine $PbI_2$ of FIG. 2(a); (e) a top-view of SEM images of the $PbI_2.(Py)_2$ film of FIG. 2(a); (f) a top-view of SEM images of the $PbI_2$.TBP film of FIG. 2(a); (g) a top-view of SEM images of the $PbI_2$.(DMSO)$_2$ film of FIG. 2(a); (h) a top-view of SEM images of the $PbI_2$.DMF film of FIG. 2(a); (i) a top-view of SEM images of the $PbI_2.(DEA)_2$ film of FIG. 2(a); (j) a transmission electron microscope (TEM) image of the $PbI_2$ of FIG. 2(a); and (k) a TEM image of the $PbI_2$ of FIG. 2(a).
Figure 2B:
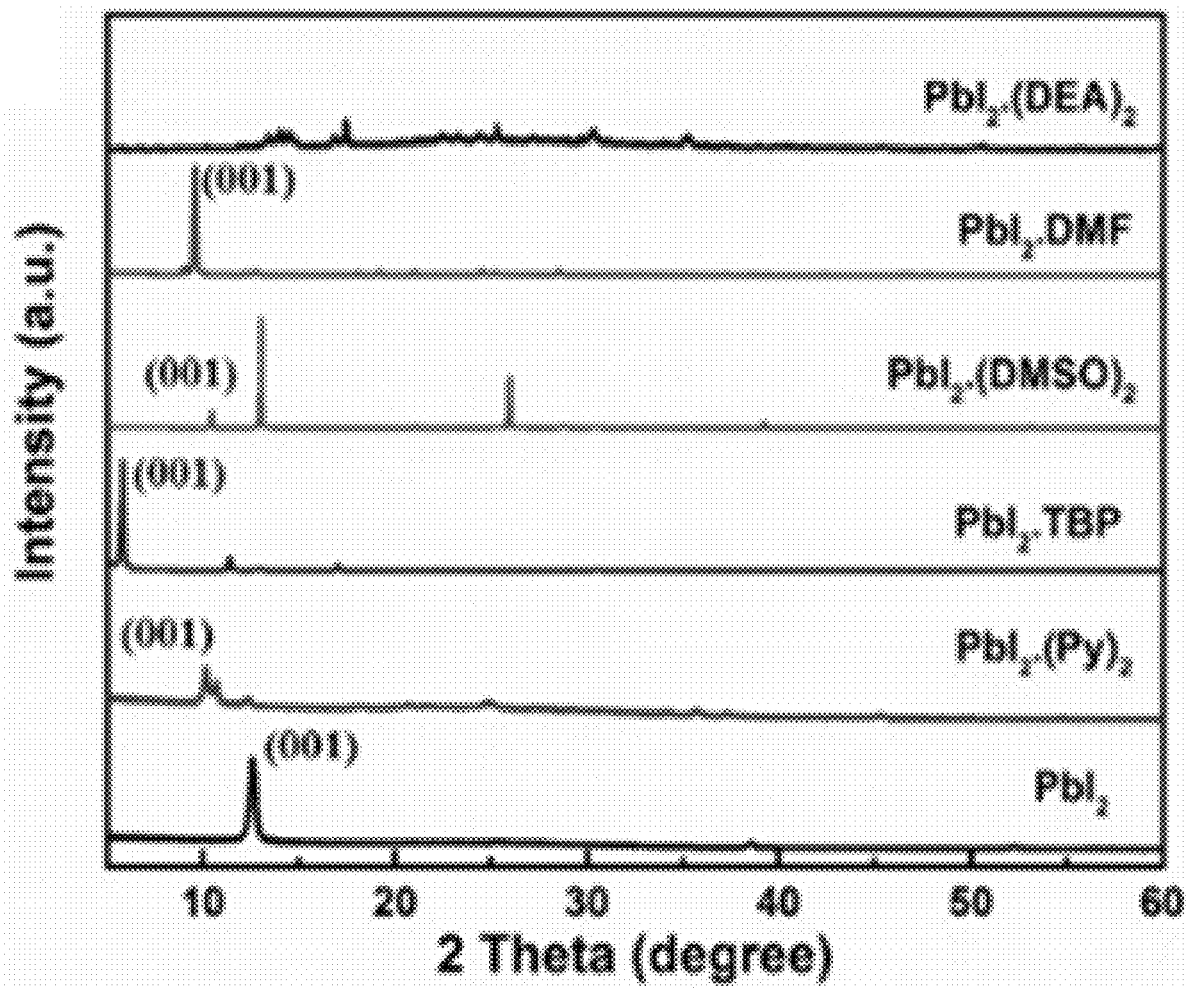
Figure 2C:
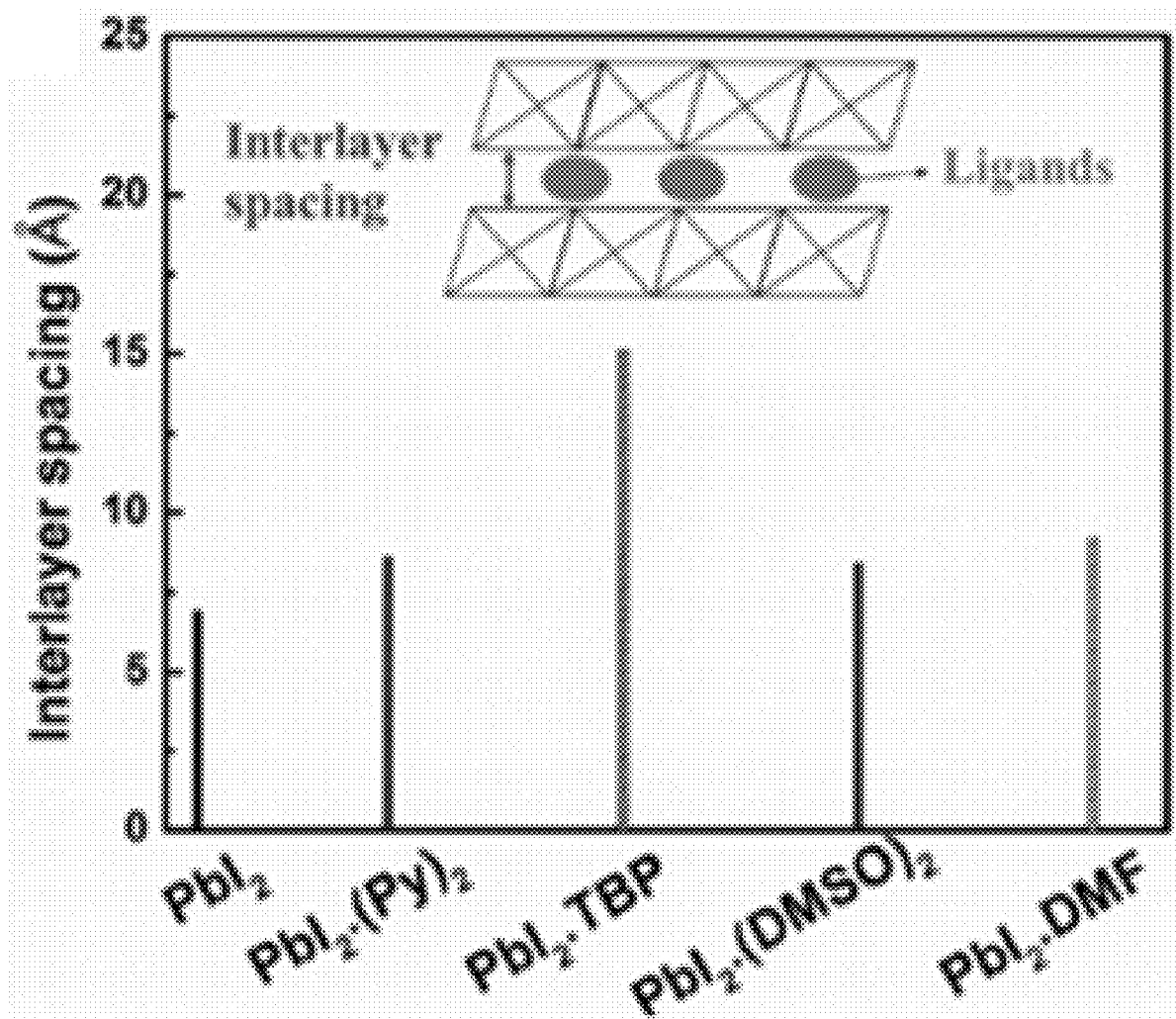

The formation and composition of PbI2.(L)x complexes can be confirmed from UV-vis spectra (FIG. 2(a)). Owing to the high volatility of DMF and EDA with boiling points of 153° C. and 116° C., respectively, the yellow-colored PbI$_2$ rapidly changed to colorless in the visible region upon treatment by their vapors for 50 seconds (The conversion rate was monitored by UV-vis spectra). The formation of colorless PbI2.(Py)2 and PbI2.(DMSO)2 took 100 sec. and 140 sec., respectively. The complete transformation of PbI2 into the PbI2.TBP complex was relatively slow (300 sec.) due to the high boiling point (197° C.) of TBP. Besides, the formation of PbI2.(L)x was further confirmed by an X-ray powder diffraction (XRD) pattern (FIG. 2(b)). After the initial PbI2 film was treated by the ligands vapor (except for DEA), it not only exhibited Bragg peaks associated with PbI2 crystal (001) planes at 12.55, but also other new peaks at low angles, indicating the formation of PbI2.(L)x complex. Meanwhile, the appearance of XRD peaks at low angles indicates that the PbI2.(L)x complex has longer interlayer distances along the c axis (see FIG. 2(c)), which is beneficial to the substitution of CH3NH3I. See, W. S. Yang, J. H. Noh, N. J. Jeon, Y. C. Kim, S. Ryu, J. Seo, S. I. Seok, Science 2015, 348, 1234 ("Yang") and N. J. Jeon, J. H. Noh, Y. C. Kim, W. S. Yang, S. Ryu, S. I. Seok, Nat Mater. 2014, 13, 897 ("Jeon"), both of which are incorporated herein by reference in their entirety. However, the PbI$_2$ coordinated with EDA tend to form a stable stoichiometric complex PbI2.(DEA)2, which showed a totally different XRD patterns from PbI2.

Figures 2D, 2E:
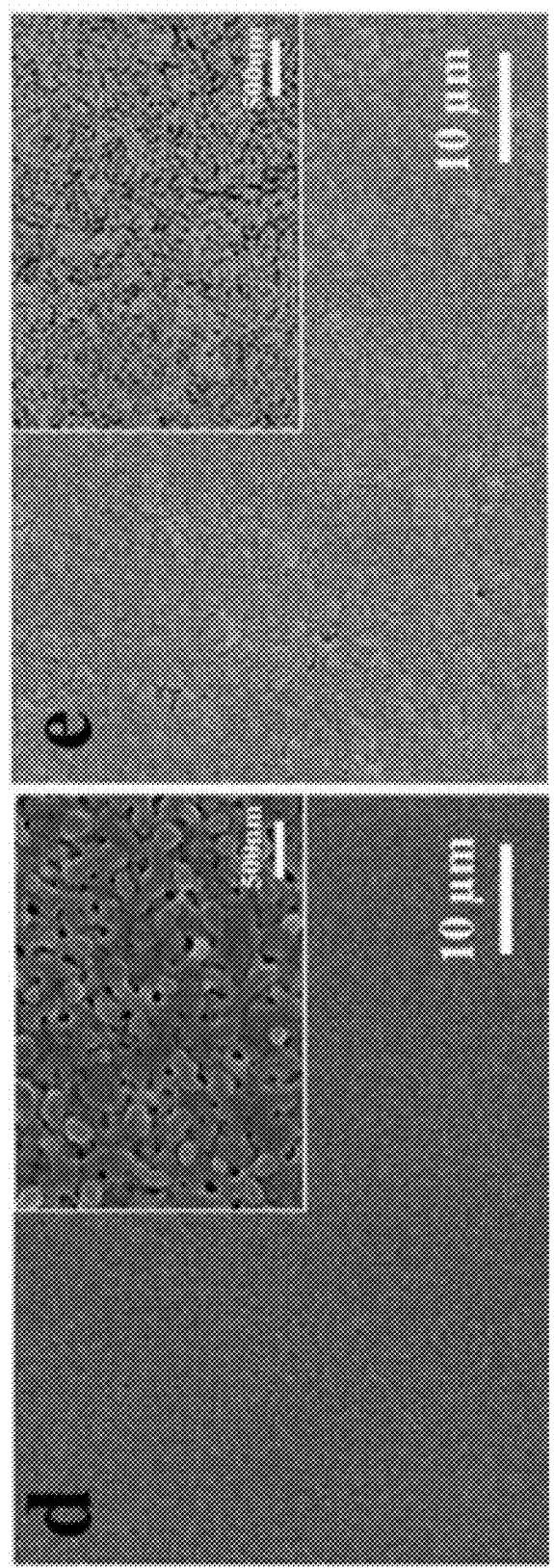
Figures 2F, 2G:
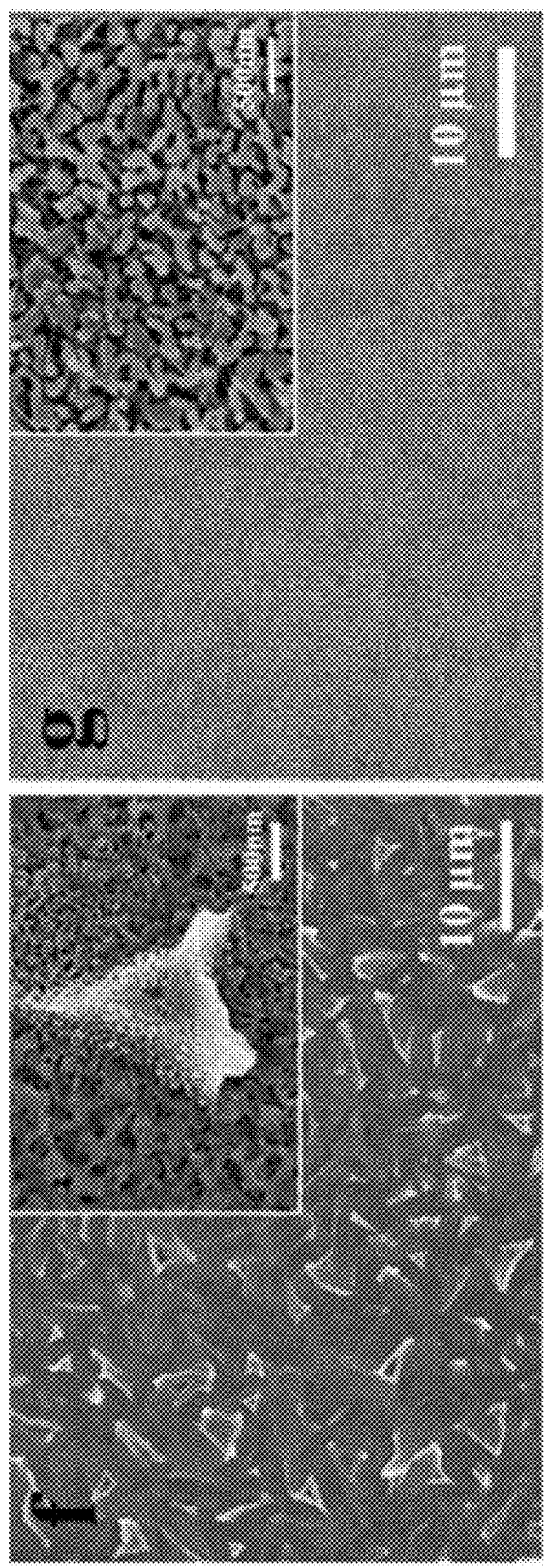
Figures 2H, 2I:
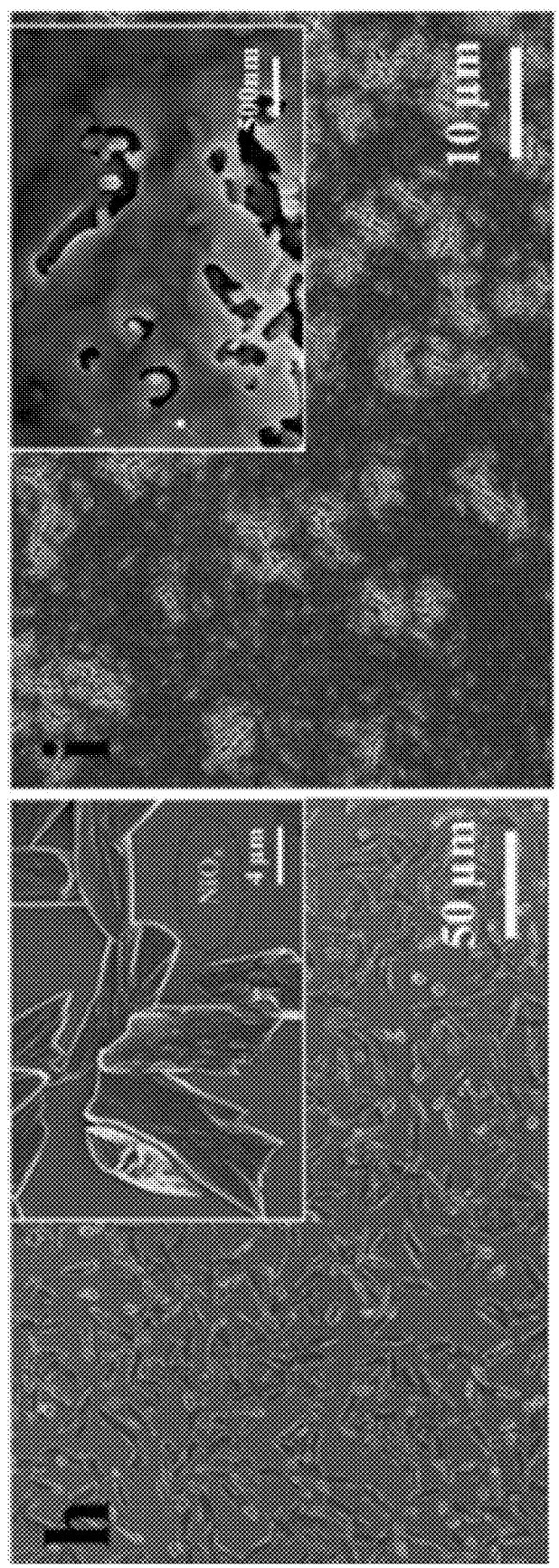
Figures 2J, 2K:
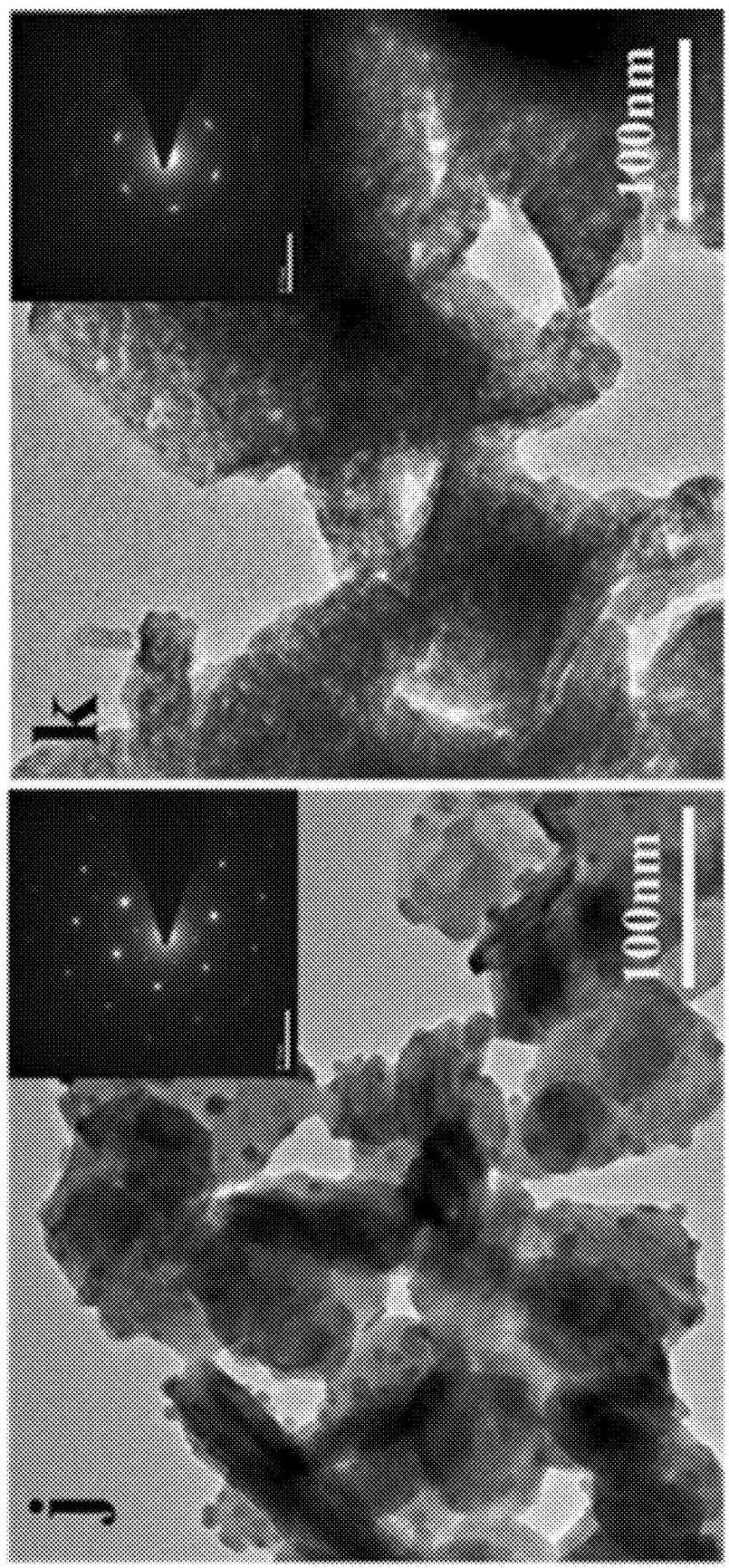

The formation process of PbI$_2$.(L)$_x$ films was revealed by SEM images as shown in FIGS. 2(d)-2(i). It should be noted that the untreated PbI$_2$ forms dense and layered crystals (FIG. 2(d)), which has been demonstrated to be detrimental to the complete conversion of PbI$_2$. See, H. Zhang, J. Mao, H. He, D. Zhang, H. L. Zhu, F. Xie, K. S. Wong, M. Grätzel, W. C. H. Choy, Adv. Energy Mater. 2015, 5, 1501354 ("Zhang") and J. Burschka, N. Pellet, S.-J. Moon, R. Humphry-Baker, P. Gao, M. K. Nazeeruddin and M. Grätzel, Nature 2013, 499, 316 ("Burschka"), both of which are incorporated herein by reference in their entirety. Interestingly, the insertion of ligands into the interlayer spaces of PbI$_2$ brought a huge morphological change for PbI$_2$.(L)$_x$ films, which verified the hypothesis above. As shown in FIG. 2(e), PbI$_2$.(Py)$_2$ complex shown a uniform and nanoporous morphology, which also has been verified by TEM images. When treated by Py vapor, the bulk PbI$_2$ nanocrystals (FIG. 2(j)) changed to porous PbI$_2$.(Py)$_2$ nanocrystals (FIG. 2(k)). While PbI$_2$.TBP complex was nonporous, its morphology was non-uniform in large scale (FIG. 2(f)). The PbI$_2$.(DMSO)$_2$ film was also porous and formed by stacked small nano-sheets (FIG. 2(g)). Notably, the process of forming PbI$_2$.DMF film underwent remarkable structure changes over this time period, exhibiting a coarsening of crystals with micrometer size and voids occur (FIG. 2(h)). The PbI$_2$.(DEA)$_2$ film was dense with some cracks (FIG. 2(i)).

Figure 3A:
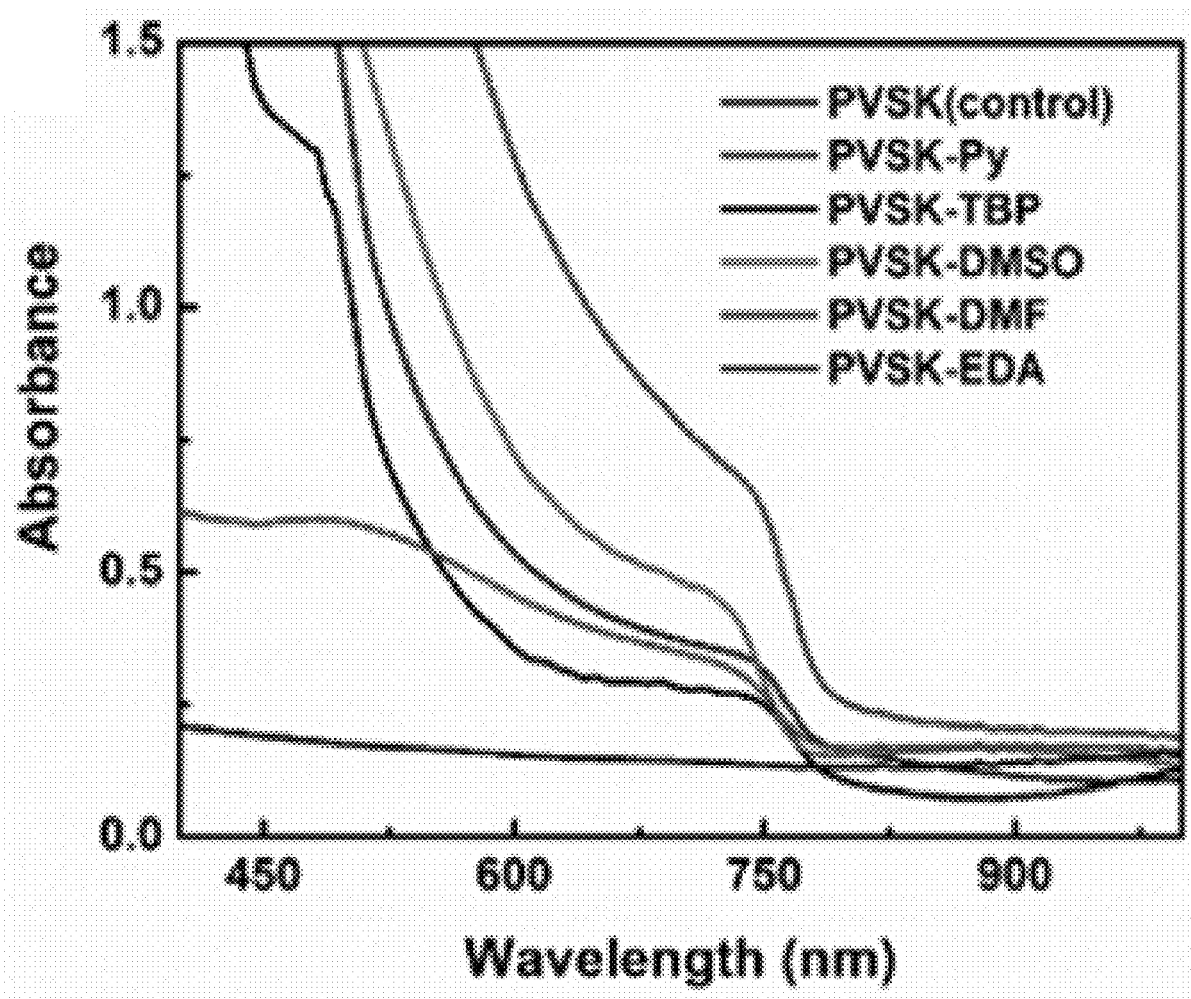
FIGS. 3(a)-(l) include: (a) a plot of XRD patterns of perovskite films from different $PbI_2.(L)x$ films after immersion in $CH_3NH_3I$ solution for 20 sec.; (b) a plot of UV-vis spectra of the perovskite films of FIG. 3(a); (c) a top-view of the SEM images of the perovskite film from $PbI_2$ film; (d) a top-view of SEM images of perovskite films from $PbI_2$.(Py)$_2$ film; (e) a top-view of SEM images of perovskite films from $PbI_2$.TBP film; (f) a top-view of SEM images of perovskite films from $PbI_2$.(DMSO)$_2$ film; (g) a top-view of SEM images of perovskite films from $PbI_2$.DMF film; (h) a top-view of an SEM image of $PbI_2$.(DEA)$_2$ film after being dipped into $CH_3NH_3I$ solution; (i) a plot of XRD patterns for the 110 reflection from the perovskite films of FIG. 3(d) before and after recrystallization; (j) a top-view of SEM images of the perovskite films of FIG. 3(d) after recrystallization; (k) a cross-sectional SEM image of the perovskite films of FIG. 3(d) after recrystallization; and (l) a magnified image of the SEM image of FIG. 3(k).
Figure 3B:
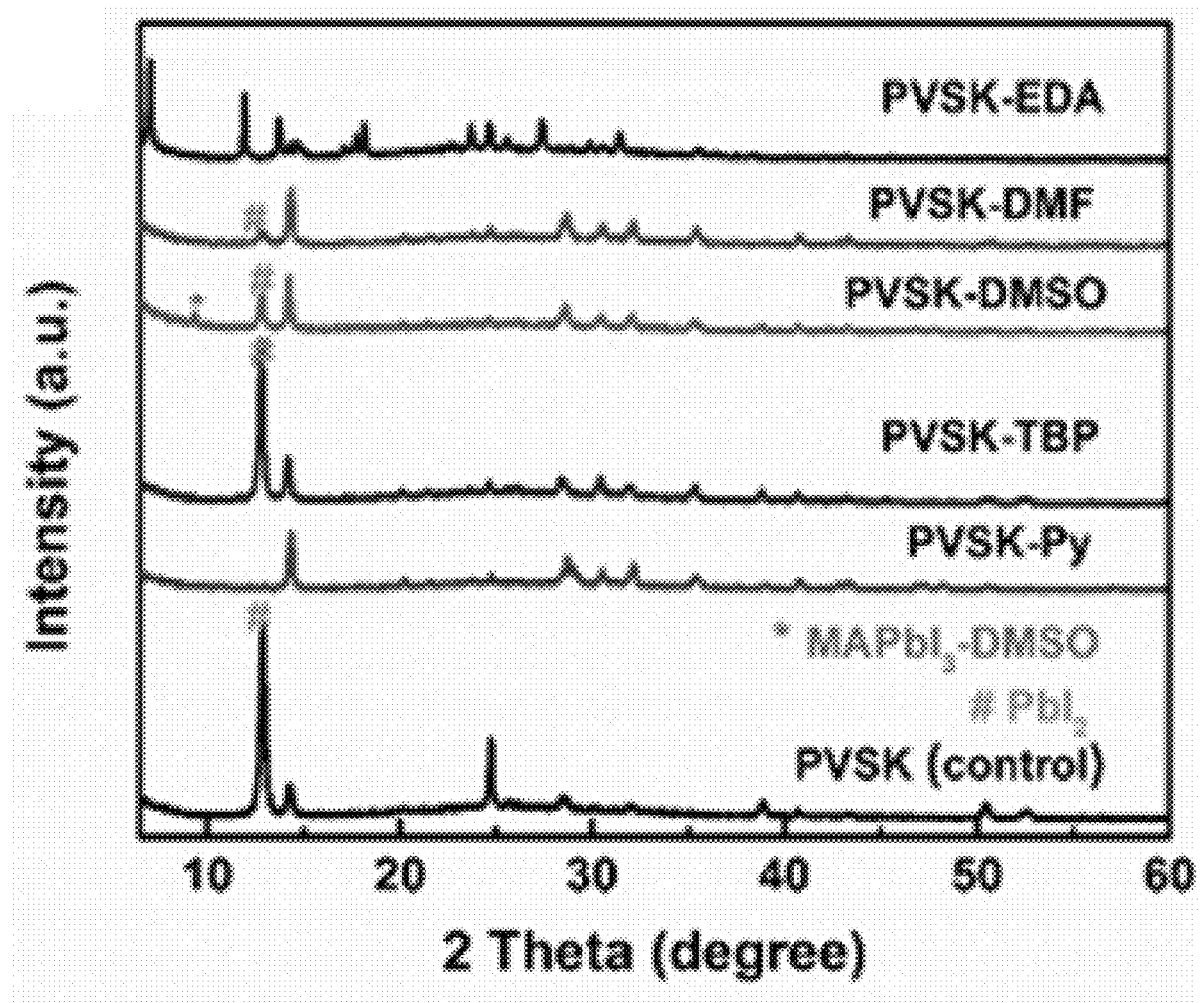
Figures 3C, 3D:
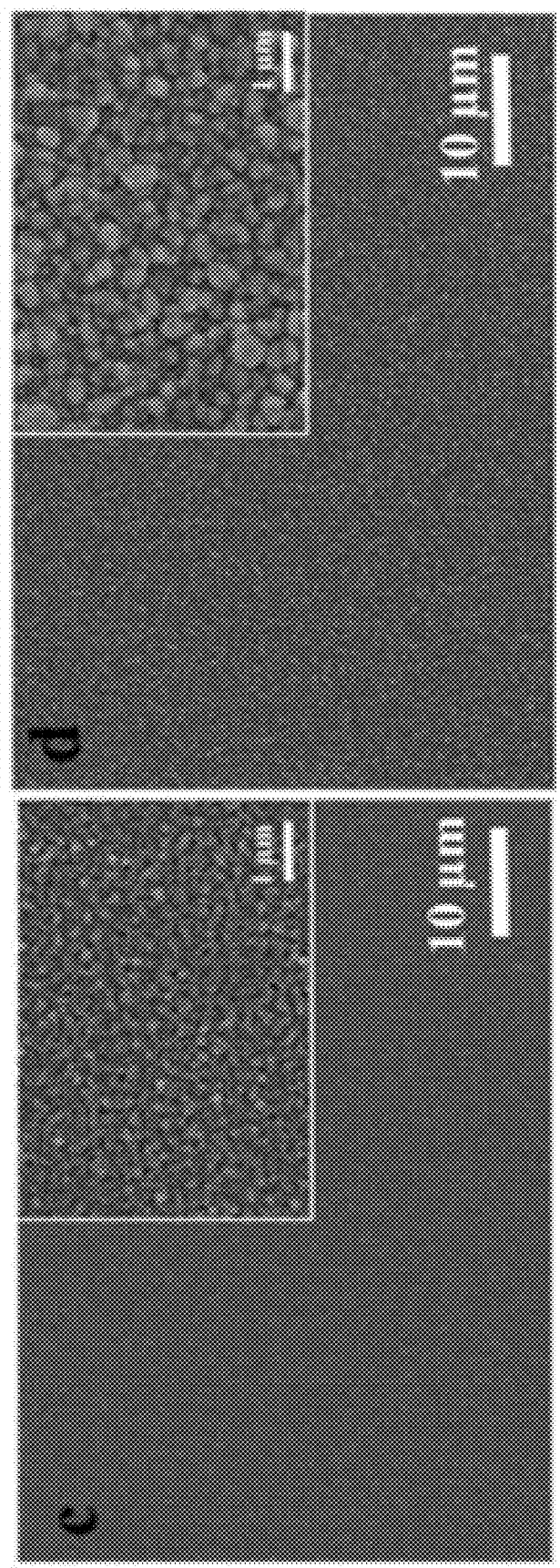
Figures 3E, 3F:
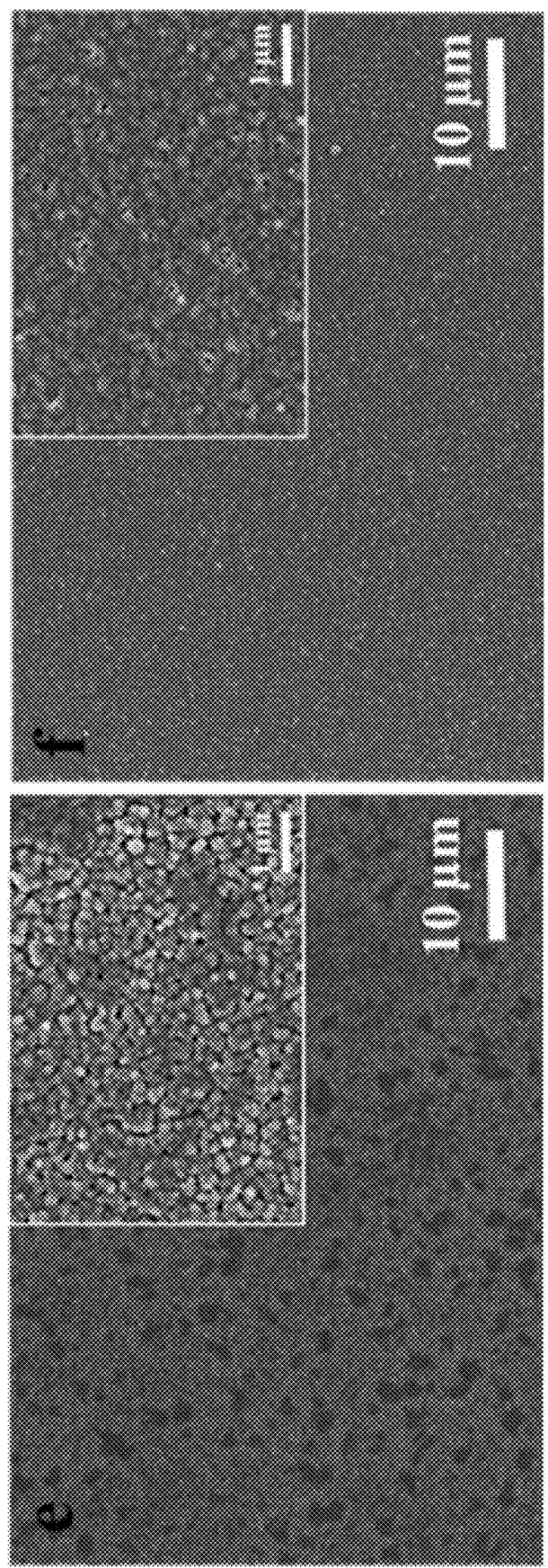
Figures 3G, 3H:
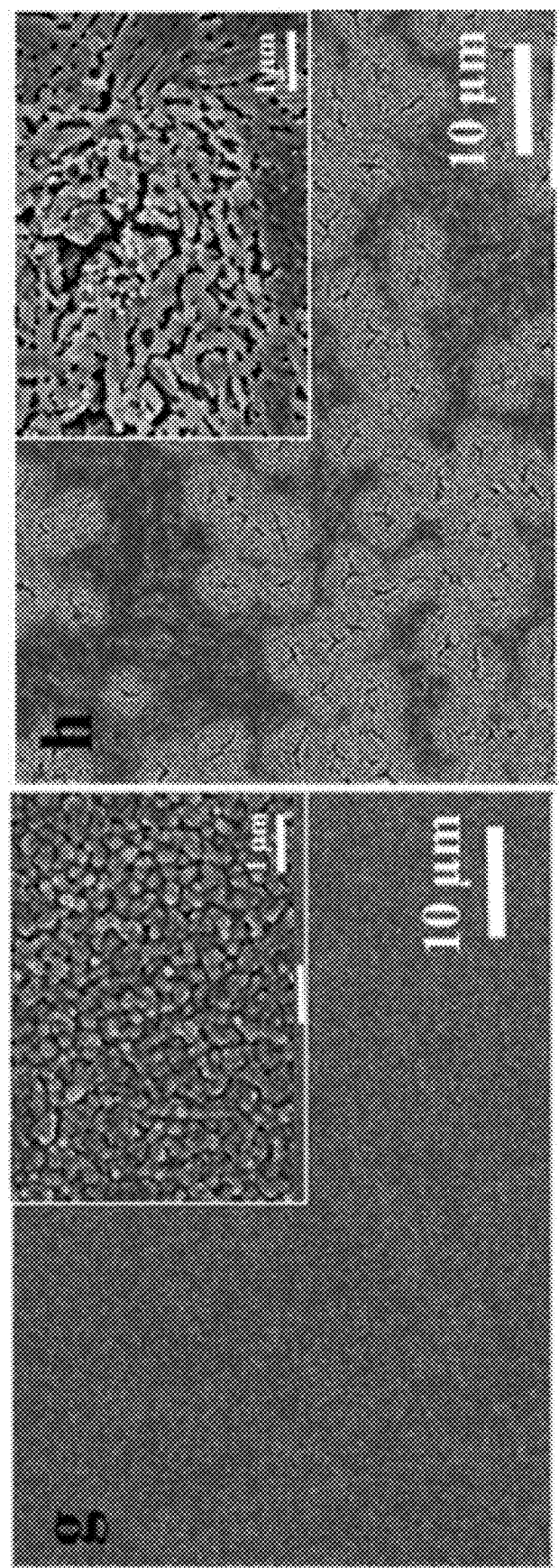

The features of the ligands also have great impact on the film quality and morphology of perovskite films. Herein, the perovskite films were fabricated by dipping the as-formed PbI$_2$.(L)$_x$ films into methylammonium iodide IPA solution (15 mg ml$^{-1}$) for 20 seconds at room temperature as shown in FIG. 1. As expected from the conversion of PbI$_2$.(L)$_x$ to methylammonium lead iodide perovskite films, the ligand molecules intercalated in PbI$_2$ will be replaced by external methylammonium iodide because of its higher affinity toward PbI$_2$ compared to ligands. Therefore, the reactivity of PbI$_2$.(L)$_x$ toward methylammonium iodide has great impact on the perovskite film's formation, which is confirmed by UV-vis spectra and XRD. Notably, for the PbI$_2$.(DEA)$_2$ complex, there is no clear light absorption (FIG. 3(a)) and XRD peaks of perovskite (FIG. 3(b)), which indicate that the affinity of DEA toward PbI$_2$ is higher than that of MAI, and thus the DEA molecule is not exchanged by methylammonium iodide to form perovskite crystals. Interestingly, PbI$_2$.(Py)$_2$ film is rapidly converted into perovskite without clear PbI$_2$ residue. While pristine PbI$_2$ and other PbI$_2$.(L)$_x$ complexes (L=TBP and DMF) are incompletely converted into perovskite with a large amount of PbI$_2$ residue, but no PbI$_2$.(L)$_x$ residue, which can be confirmed by the XRD patterns (FIG. 3(b)). However, owing to the strong affinity of DMSO toward PbI$_2$, PbI$_2$.(DMSO)$_2$ residue is still detected.

Figure 3I:
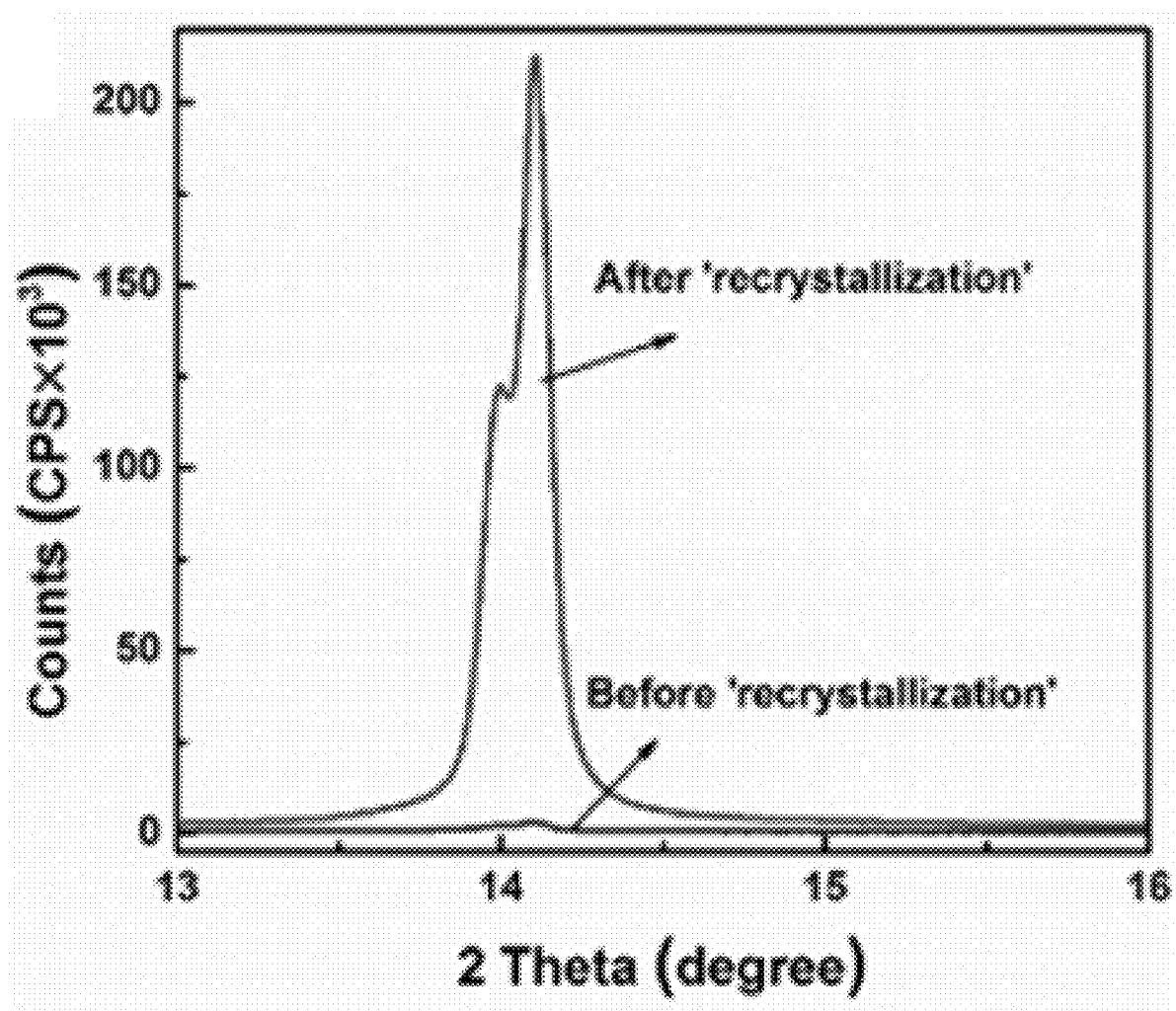
Figure 3J:
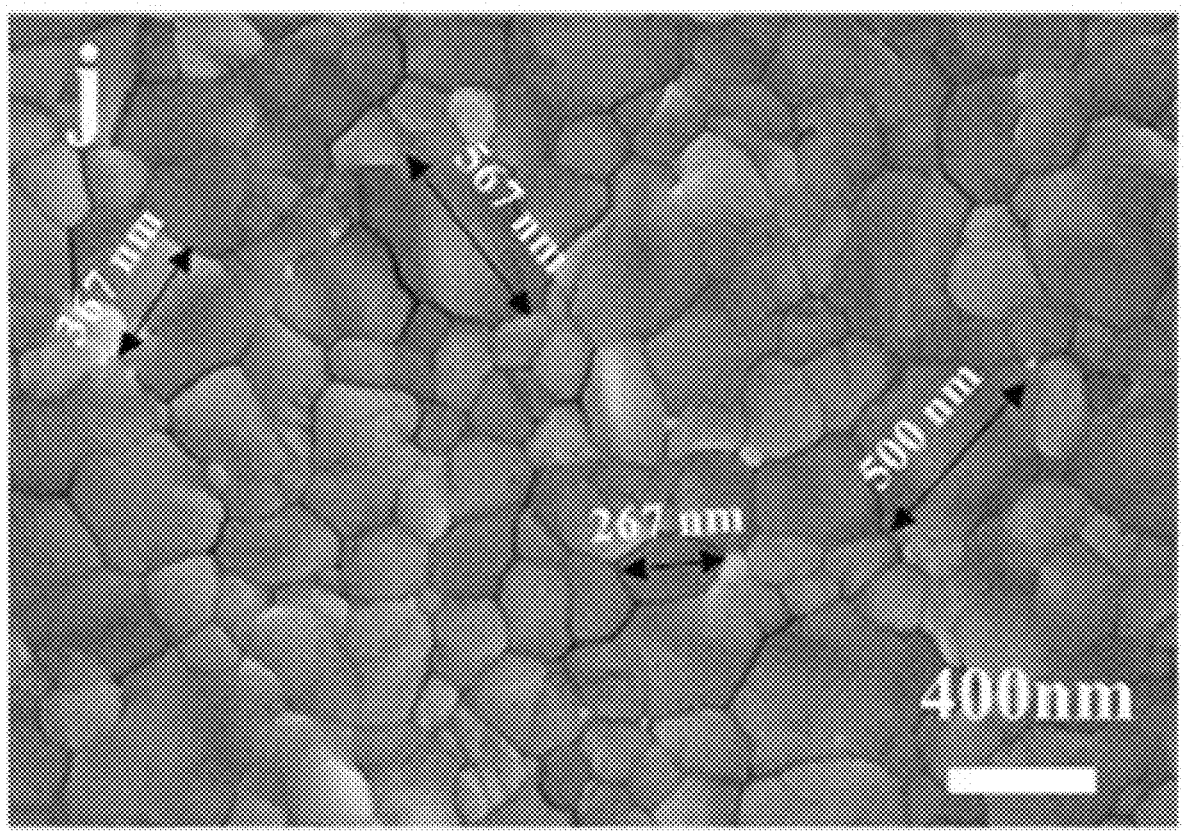
Figure 3K:
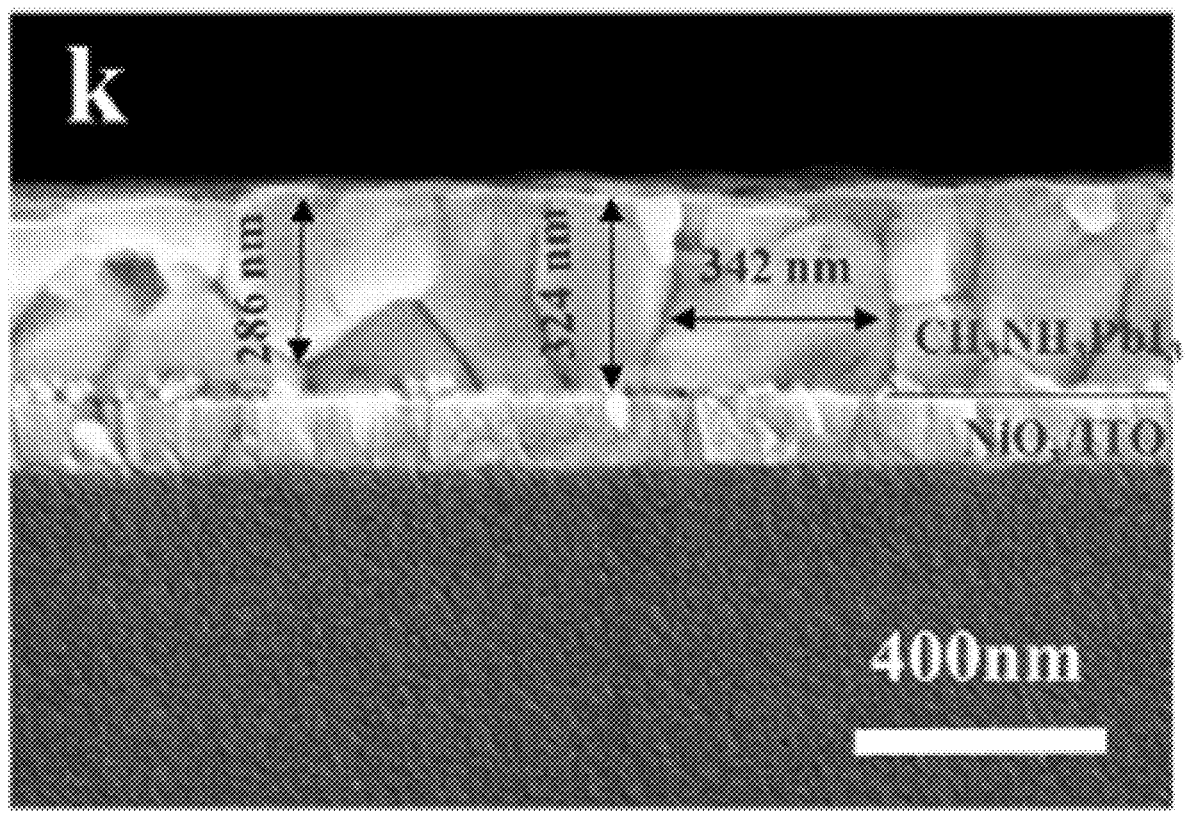
Figure 3L:
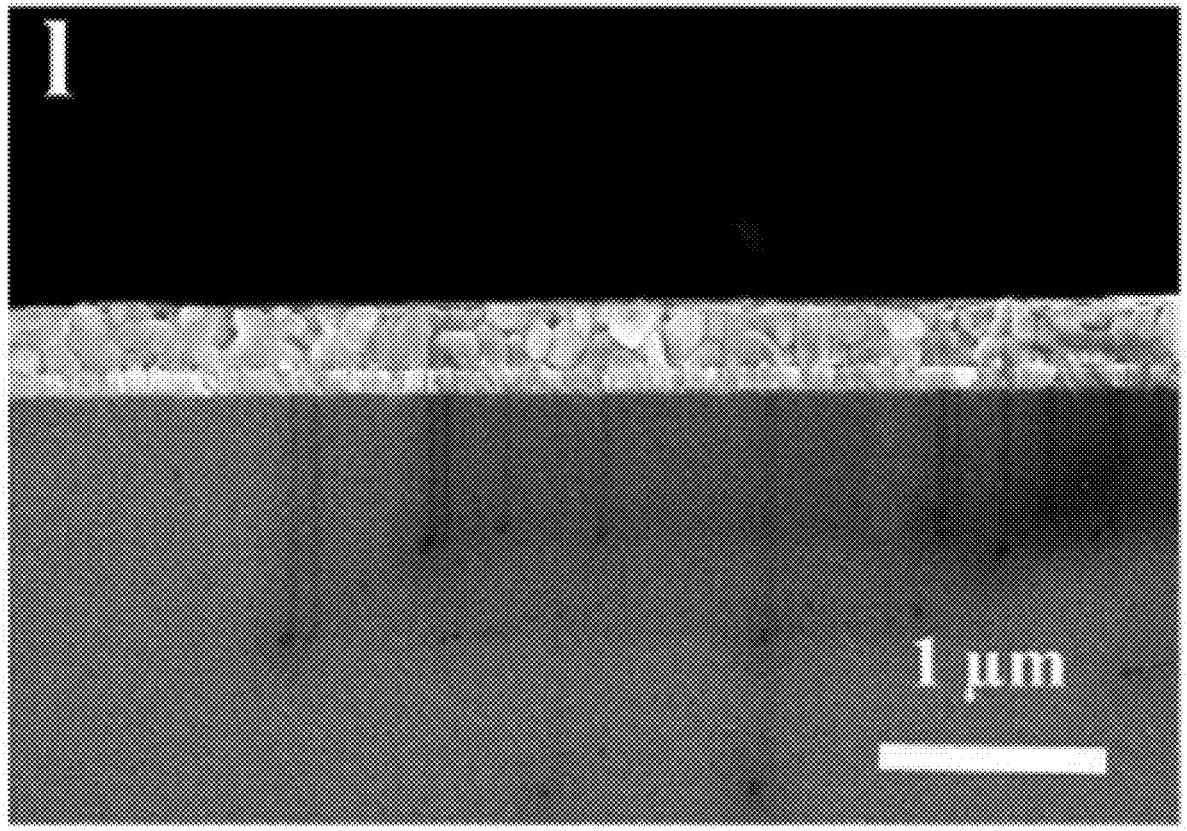

FIGS. 3(c)-3(h) show the top-view SEM images of methylammonium lead iodide perovskite films from different PbI$_2$.(L)$_x$ complexes. As expected the morphology of perovskite films depends on their starting PbI$_2$ film in the two-step dipping method. See the Zhang and Burschka articles with P. Gao, M. Gratzel, M. K. Nazeeruddin, Energy Environ. Sci. 2014 7, 2448 ("Gao") and Y. Wu, A. Islam, X. Yang, C. Qin, J. Liu, K. Zhang, W. Peng, L. Han, Energy Environ. Sci. 2014, 7, 2934 ("Wu"), both of which are incorporated herein by reference in their entirety. The perovskite films prepared from pristine PbI$_2$ and PbI$_2$.(L)$_x$ complex (L=TBP, DMSO, and DMF) are rough with small grains, voids and cracks. Notably, the perovskite film prepared from PbI$_2$.(Py)$_2$ complex exhibits a uniform/smooth morphology and hundred nanometer sized grains. FIG. 3(i) shows the XRD intensity for the as-prepared perovskite films and 'recrystallized' perovskite films under identical measurement conditions, showing an over 200-fold increase in the counts after recrystallization. This change is indicative of higher degree of crystallinity and texture in the recrystallized perovskite film. As shown in FIGS. 3(j)-3(l), the top-view SEM images illustrate that the recrystallized perovskite films are more ultra-smooth with few gain boundaries, which are similar to that prepared from thermal annealing process.

Example 2

All-room-temperature processed PVSCs on ITO glass can be fabricated using the perovskite film described above as an absorber. The nanostructure-based $NiO_x$ film and commercial electron transport materials such as fullerene ($C_{60}$) are used to form a hole transport layer (HTL) and an electron transport layer (ETL) in the all-room-temperature solution-processed PVSCs, respectively.

The photovoltaic parameters of PVSCs fabricated form different $PbI_2.(L)x$ complexes are summarized in Table 2. The results in Table 2 reveal that PVSC performances depend on the selection of chemical ligands. The performance of control perovskite (prepared from pristine $PbI_2$ film) is very poor and the average PCE is only 1.29%. The use of $PbI_2.(Py)_2$ complexes significantly improves photovoltaic performances and the overall average PCE dramatically increases to 15.80%. The improvement predominantly lies in the increased Jsc (from 2.17 to 22.14 mA cm$^{-2}$), which is attributed to the highly crystalline and pure perovskite films. The $PbI_2$.TBP and $PbI_2.(DMSO)_2$ complexes also provide an improvement in photovoltaic performances, yielding an average PCE of 11.45% and 9.61%, respectively. However, owing to the non-uniform and impure perovskite film with many pinholes, the $PbI_2$.DMF-based device have a low Voc of 0.85V, a Jsc of 16.30 mA cm$^{-2}$ and a FF of 0.59, resulting in a relatively bad PCE of 8.17%. Notably, owing to the uniform perovskite crystals, the $PbI_2.(DEA)_2$-based device depicts no photovoltaic performance.

TABLE 2

The photovoltaic parameters of PVSCs fabricated from different $PbI_2•(L)_x$ complexes

| Sample | $J_{sc}$ (mA/cm$^2$) | $V_{oc}$ (V) | FF | PCE (%)$^a$ |
|---|---|---|---|---|
| $PbI_2$ | 2.17 ± 0.13 | 0.92 ± 0.01 | 0.65 ± 0.01 | 1.29 ± 0.14 |
| $PbI_2•(Py)_2$ | 22.17 ± 0.42 | 0.99 ± 0.02 | 0.72 ± 0.02 | 15.80 ± 0.72 |
| $PbI_2•TBP$ | 17.56 ± 0.45 | 1.02 ± 0.02 | 0.64 ± 0.01 | 11.45 ± 0.51 |
| $PbI_2•(DMSO)_2$ | 17.02 ± 0.35 | 0.96 ± 0.01 | 0.59 ± 0.02 | 9.61 ± 0.32 |
| $PbI_2•DMF$ | 16.30 ± 0.55 | 0.85 ± 0.02 | 0.59 ± 0.02 | 8.17 ± 0.45 |
| $PbI_2•(DEA)_2$ | — | — | — | — | a) The statistics are determined from 15 devices.

Further improving the crystallinity of the perovskite films prepared form $PbI_2.(Py)_2$ complexes by methylamine/methanol gas mixture treatment for 1-5 sec., the best device based on the recrystallized perovskite film exhibited a Jsc of 22.60 mA cm$^{-2}$, a Voc of 1.05 V and an FF of 0.721, corresponding to a PCE of 17.10% as shown in FIG. 4(b). The photon-to-electron conversion efficiency (IPCE) spectrum is shown in FIG. 4(c), which is consistent with the Jsc from the current density-voltage (J-V) curves. Meanwhile, the stabilized power output with time was also investigated (FIG. 4(d)). The photocurrent stabilizes within seconds to approximately 19.4 mA cm$^{-2}$, yielding a stabilized power conversion efficiency of 17.07%, measured after 100 sec. In order to investigate the reproducibility of the PVSCs, 30 separate devices were fabricated and tested. The histograms of the device efficiencies are presented in FIG. 4(e). Approximately 85% of the cells show PCE over 15%. Besides, FIG. 4(f) shows the air stability of the devices fabricated by this room temperature technique. The encapsulated device demonstrated good stability over a period of 1000 hours and maintained over 95% of its initial efficiency. To better understand the hysteresis of the PVSCs according to exemplary embodiments of the invention, the devices were measured under different scan directions and scan rates (FIG. 4(g)). Notably, the room temperature processed devices exhibited negligible hysteresis, which should be due to the highly crystalline perovskite films and the fullerene effect. See (a) Y. Zhao, C. Liang, H. Zhang, D. Li, D. Tian, G. Li, X. Jing, W. Zhang, W. Xiao, Q. Liu, F. Zhang, Z. He, Energy Environ. Sci. 2015, 8, 1256; (b) H.-S. Kim, N.-G. Park, J. Phys. Chem. Lett. 2014, 5, 2927; and (c) Y. Shao, Z. Xiao, C. Bi, Y. Yuan, J. Huang, Nat. Commun. 2014, 5, 5784, each of which is incorporated herein by reference in its entirety.

Example 3

Figure 5:
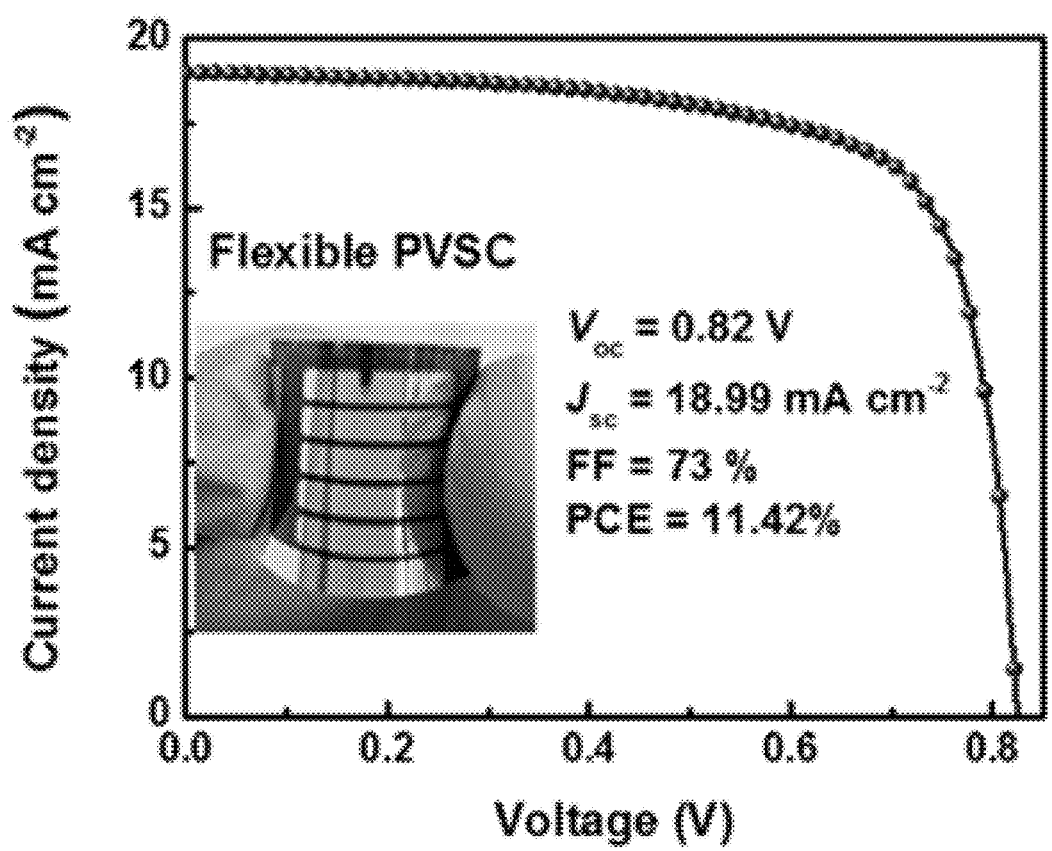
FIG. 5 is a J-V curve and the photograph (inserted) of a flexible PVSC on a polyethylene terephthalate (PET) substrate.

By taking advantage of the room temperature techniques, flexible PVSCs utilizing ITO/PET as the conductive transparent electrode can be fabricated. FIG. 5 shows the J-V curve of the PVSCs using flexible ITO/PET substrates under AM 1.5 G irradiation and a photograph of a flexible PVSCs. The best flexible PVSC exhibits a Voc of 0.82V, a Jsc of 18.99 mA cm$^{-2}$ and an FF of 0.73, corresponding to a high PCE of 11.42%, which is the highest PCE of flexible PVSCs fabricated by low temperature techniques.

Furthermore, in comparison to the previous studies on room temperature fabrication of PVSCs, the cells of the present invention are more efficient. See, D. Liu, T. L. Kelly, Nat. Photon. 2014, 8, 133; U. Bansode, R. Naphade, O. Game, S. Agarkar, S. Ogale, J. Phys. Chem. C 2015, 119, 9177 and Y. Chen, Y. Zhao, Z. Liang, Chem. Mater. 2015, 27, 1448, each of which is incorporated herein by reference in its entirety.

What is more important, the Jsc of the present PVSCs is higher by ~1-2 mA cm$^{-2}$ as compared to previous studies. The Jsc value of 21-23 mA cm$^{-2}$ is closer to that of the champion cells with conventional device configuration based on $TiO_2/CH_3NH_3PbI_3$/spiro-OMeTAD. See, N. Ahn, D.-Y. Son, I.-H. Jang, S. M. Kang, M. Choi, N.-G. Park, J. Am. Chem. Soc. 2015, 137, 8696, which is incorporated herein by reference in its entirety.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated as being within the scope of the invention without limitation thereto.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

We claim:

1. A method for room-temperature fabrication of an organolead halide perovskite film, comprising:
   forming a $PbX_2.(L)_y$ film based on solid-gas reactions between ligand (L) vapor and a $PbX_2$ film at room temperature;
   forming a perovskite film by exposing the $PbX_2.(L)_y$ film to a solution of organic ammonium halide at room temperature;
   removing the perovskite film from the solution of organic ammonium halide;
   exposing the perovskite film to a methylamine/alcohols gas mixture;
   removing the perovskite film from the methylamine/alcohols gas mixture; and
   drying the perovskite film.

2. The method according to claim 1, wherein forming the $PbX_2$ film comprises depositing a $PbX_2$ solution on a substrate by spin coating, drop casting, spray coating, a Mayer rod technique, or a doctor blade technique.

3. The method according to claim 2, wherein the $PbX_2$ solution comprises $PbI_2$, $PbBr_2$, $PbCl_2$, $Pb(C_2H_3O_2)_2$ or a combination thereof.

4. The method according to claim 2, wherein the concentration of the $PbX_2$ solution is in a range from 0.05 millimolar to 1.50 millimolar.

5. The method according to claim 1, wherein the ligand (L) vapor comprises pyridine, 4-tert-butylpyridine, ethylene diamine, N,N'-dimethylmethanaide, dimethyl sulfoxide, or a combination thereof.

6. The method according to claim 1, wherein a $PbX_2$ film to ligand ratio is determined based on a reaction time between the $PbX_2$ film and the ligand (L) vapor, and wherein the reaction time is in a range from 10 seconds to 100 seconds.

7. The method according to claim 1, wherein the organic ammonium halide comprises methylammonium iodide, methylammonium bromide, methylammonium chloride, formamidinium iodide, formamidinium bromide, formamidinium chloride, or a combination thereof, and wherein the concentration of the organic ammonium halide is in a range from 0.03 millimolar to 0.50 millimolar.

8. The method according to claim 1, wherein the exposure time of $PbX_2.(L)_y$ in the solution of organic ammonium halide is in a range from 10 seconds to 1000 seconds.

9. The method according to claim 1, wherein the methylamine/alcohols gas mixture comprises methanol, ethanol, isopropyl alcohol (IPA), or a combination thereof, and wherein the ratio of methylamine to alcohols is in a range from 1:20 to 20:1.

10. The method according to claim 1, wherein the duration of exposing the perovskite film to the methylamine/alcohols gas mixture is in a range from 1 second to 60 seconds.

11. The method according to claim 1, wherein the organolead halide perovskite film exhibits a highly crystalline phase having an X-ray diffraction (XRD) peak relative intensity of (110):(220):(330)=1:0.67:0.09 and grain size in a range of 300-600 nm.

12. The method according to claim 1, further comprising:
    forming a $PbX_2$ solution;
    forming the $PbX_2$ film at room temperature from the $PbX_2$ solution; and
    drying the $PbX_2$ film.

13. The method according to claim 1, wherein before exposing the perovskite film to the methylamine/alcohols gas mixture, the method further comprises:
    washing the perovskite film with isopropyl alcohol (IPA); and
    drying the perovskite film.

14. A method for room-temperature solution-processed fabrication of a flexible perovskite solar cell, the method comprising:
    depositing a formation solution comprising $NiO_x$ nanoparticles dissolved therein on a flexible transparent conductive substrate, such that the $NiO_x$ nanoparticles form a nanostructured $NiO_x$;
    fabricating an organolead halide perovskite film on the substrate having the nanostructured $NiO_x$, wherein fabricating the organolead halide perovskite film further comprises:
       forming a $PbX_2.(L)_y$ film based on solid-gas reactions between ligand (L) vapor and a $PbX_2$ film at room temperature;
       forming a perovskite film by exposing the $PbX_2.(L)_y$ film to a solution of organic ammonium halide at room temperature;
       removing the perovskite film from the solution of organic ammonium halide;
       exposing the perovskite film to a methylamine/alcohols gas mixture;
       removing the perovskite film from the methylamine/alcohols gas mixture; and
       drying the perovskite film;
    depositing an electron transport layer on the organolead halide perovskite film; and
    depositing a conductive electrode on the electron transport layer.

15. The method according to claim 14, wherein the thickness of the organolead halide perovskite film is in a range from 50 nanometers to 1000 nanometers.

* * * * *